(12) United States Patent
Luo

(10) Patent No.: US 8,185,782 B2
(45) Date of Patent: May 22, 2012

(54) TEST DEVICE AND METHOD FOR HIERARCHICAL TEST ARCHITECTURE

(75) Inventor: Kun-Lun Luo, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 349 days.

(21) Appl. No.: 12/324,795

(22) Filed: Nov. 26, 2008

(65) Prior Publication Data

US 2009/0259889 A1    Oct. 15, 2009

(30) Foreign Application Priority Data

Apr. 14, 2008  (TW) .............................. 97113458 A

(51) Int. Cl.
*G06F 11/00* (2006.01)
(52) U.S. Cl. .......................................................... 714/30
(58) Field of Classification Search .............. 714/10–13, 714/25–38, 42–44, 48–50, 726–733
See application file for complete search history.

(56) References Cited

U.S. PATENT DOCUMENTS

| | | | |
|---|---|---|---|
| 6,122,762 A * | 9/2000 | Kim ............................... | 714/726 |
| 6,324,614 B1 * | 11/2001 | Whetsel ......................... | 714/726 |
| 6,324,662 B1 | 11/2001 | Haroun et al. | |
| 6,381,717 B1 | 4/2002 | Bhattacharya | |
| 6,425,100 B1 | 7/2002 | Bhattacharya | |
| 6,631,504 B2 * | 10/2003 | Dervisoglu et al. .......... | 716/136 |
| 7,058,862 B2 | 6/2006 | Whetsel et al. | |
| 7,506,231 B2 * | 3/2009 | Chang et al. ................... | 714/726 |
| 7,519,884 B2 * | 4/2009 | Whetsel ......................... | 714/726 |
| 7,529,996 B2 * | 5/2009 | Whetsel ......................... | 714/731 |
| 2005/0050413 A1 * | 3/2005 | Whetsel ......................... | 714/724 |
| 2005/0268193 A1 * | 12/2005 | Waayers ......................... | 714/727 |
| 2007/0255986 A1 * | 11/2007 | Chang et al. .................. | 714/724 |
| 2008/0010569 A1 * | 1/2008 | Whetsel ......................... | 714/724 |
| 2008/0034262 A1 * | 2/2008 | Whetsel ......................... | 714/729 |

OTHER PUBLICATIONS

Kuen-Jong Lee et al., "A Hierarchical Test Control Architecture for Core Based Design", pp. 248-253, 2000 IEEE, US.
Jin-Fu Li et al., "A Hierarchical Test Scheme for System-on-Chip designs", Proceedings of the 2002 Design, Automation and Test in Europe Conference and Exhibition, 5 pages, 2002 IEEE, France.
Jaehoon Song et al., "A Simple Wrapped Core Linking Module for SoC Test Access", Proceedings of the 11th Asian Test Symposium, 6 pages, 2002 IEEE, US.
"IEEE Standard Test Access Port and Boundary-Scan Architecture," The Institute of Electrical and Electronics Enginners, Inc. Jul. 2001, 200 pages, IEEE, US.
"IEEE Standard Testability Method for Embedded Core-based Integrated Circuits," The institute of Electrical and Electronics Enginners, Inc. Aug. 2005, 127 pages, IEEE, US.
Jin-Fu Li et al., "A Hierarchical Test Scheme for System-on-Chip Designs," Proceedings of the 2002 Design, Automation and Test in Europe Conference and Exhibition, Aug. 2002, pp. 486-490, IEEE, US.

* cited by examiner

*Primary Examiner* — Nadeem Iqbal

(57) ABSTRACT

A test device for a hierarchical test architecture is disclosed. The architecture includes cores for plural test layers, a top-level data register, and a top-level test controller. Cores for each test layer are hierarchical test circuits. The top-level test controller retrieves plural control signals, controls the top-level data register based on first type control signals in the control signals, and controls each core based on second type control signals in the control signals.

41 Claims, 20 Drawing Sheets

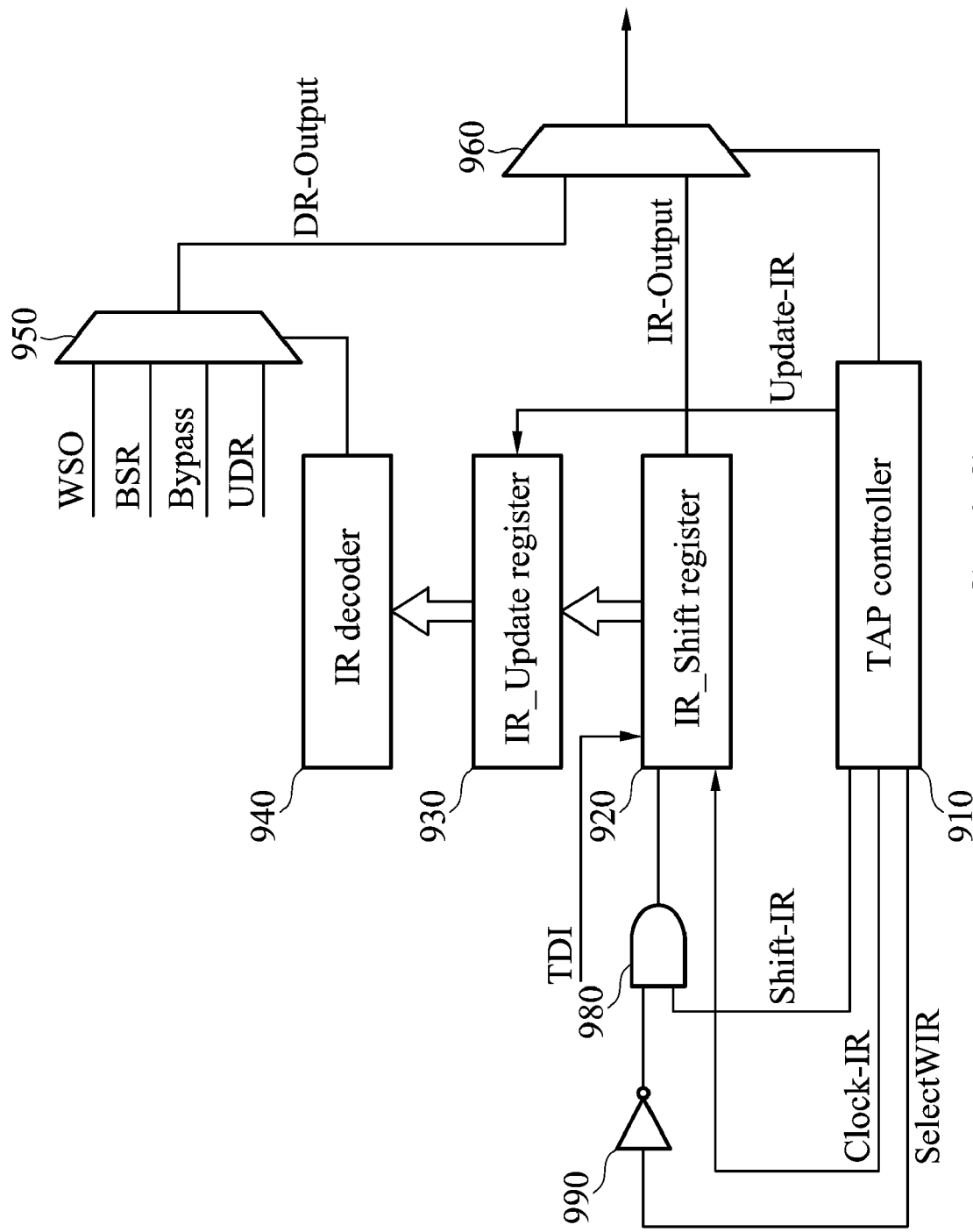

TEST DEVICE AND METHOD FOR HIERARCHICAL TEST ARCHITECTURE

BACKGROUND OF THE INVENTION

1. Field of the Invention

The invention relates to a System-on-a-Chip (SoC) test architecture, and more particularly to a test device for a hierarchical test architecture.

2. Description of the Related Art

System-on-a-Chip (SoC) devices are widely used today. With combining more and more different functions (cores) from different sources, the fault coverage of a core-based SoC device has been decreased dramatically. In order to reduce the test complexity of a SoC device, and for the purpose of test reuse, the IEEE (Institute of Electrical and Electrical and Electronic Engineers) has defined IEEE 1500 test standard, the test standard for core-based design.

FIG. 1 is showing the test wrapper defined by IEEE 1500.

Conforming to IEEE 1500 standard, a test wrapper 120 is wrapped around a core 110. The test wrapper 120 includes an N-bit wrapper instruction register (WIR) (not shown) for storing a test instruction, a 1-bit wrapper bypass register (WBY) (not shown), a wrapper boundary register (WBR) 130 for storing test data, a serial interface layer 140 and a set of standard wrapper serial control (WSC), wherein WIR and WBY are included in the serial interface layer 140. In addition, the test circuit can access data registers (DR) inside the core for testing the core. This type of data register is called a core data register (CDR).

In core-based design, another test standard, the IEEE 1149.1 standard can also be used, as shown in FIG. 2. The IEEE 1149.1 standard is designated for testing, and debugging a chip that is mounted on a printed-circuit board (PCB) and also for testing the interconnections between the chips that are mounted on the same PCB. Conforming to the IEEE 1149.1 standard, a core 210, a set of test access port (TAP) test signals (composed of TDI, TDO, TMS, TCK and optional TRST), a boundary-scan register (BSR, composed of serial linked boundary scan cells) 225 connected to input/output (I/O) ports 220 and an inner core 210, a user-defined data register (UDR) 230, an N-bit instruction register (IR) 240, a 1-bit bypass register 250, a TAP controller 260 and a multiplexer 270. The TAP controller 260 is composed of a finite state machine (FSM), a 4-bit state register and control circuits. FIG. 3 is a state diagram showing the FSM in the TAP controller 260, wherein all indicated states values are stored in the state register as the states of the state machine.

For the IEEE 1149.1 standard, data registers and corresponding test instructions other than the standard mandatory and optional instructions can be defined. By using the TAP controller, users can control testing processes and testing data path of an integrated circuit (IC). In addition to PCB testing, the IEEE 1149.1 standard can also be used to test and debug the inner cores of a SoC.

In addition, a core that is wrapped in a test wrapper conforming to the IEEE 1149.1 or IEEE 1500 standard may contain the other cores that are also wrapped in a test wrapper conforming to the IEEE 1149.1 or IEEE 1500 standard, the kind of test architecture may also be referred to as a hierarchical test architecture. In order to integrate the cores that are wrapped in the test wrappers conforming to the IEEE 1149.1 standard or IEEE 1500 standard and control the hierarchical test architecture, the present invention provides a test device and a method for a hierarchical test architecture.

BRIEF SUMMARY OF THE INVENTION

A test device for controlling a hierarchical test architecture is provided, comprising: a top level test circuit, comprising: a top level data register; and a top level test controller, obtaining a plurality of test control signals and generating a plurality of control signals, wherein the control signals comprise a first set of control signals and a second set of control signals, and control the top level data register using the first set of control signals; and a next test level, composed of one or more cores having a test wrapper, wherein the core is controlled by the top level test controller using the second set of control signals.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 9C is a schematic view of the instruction register controller of another embodiment of the present invention.

DETAILED DESCRIPTION OF THE INVENTION

Figure 1:
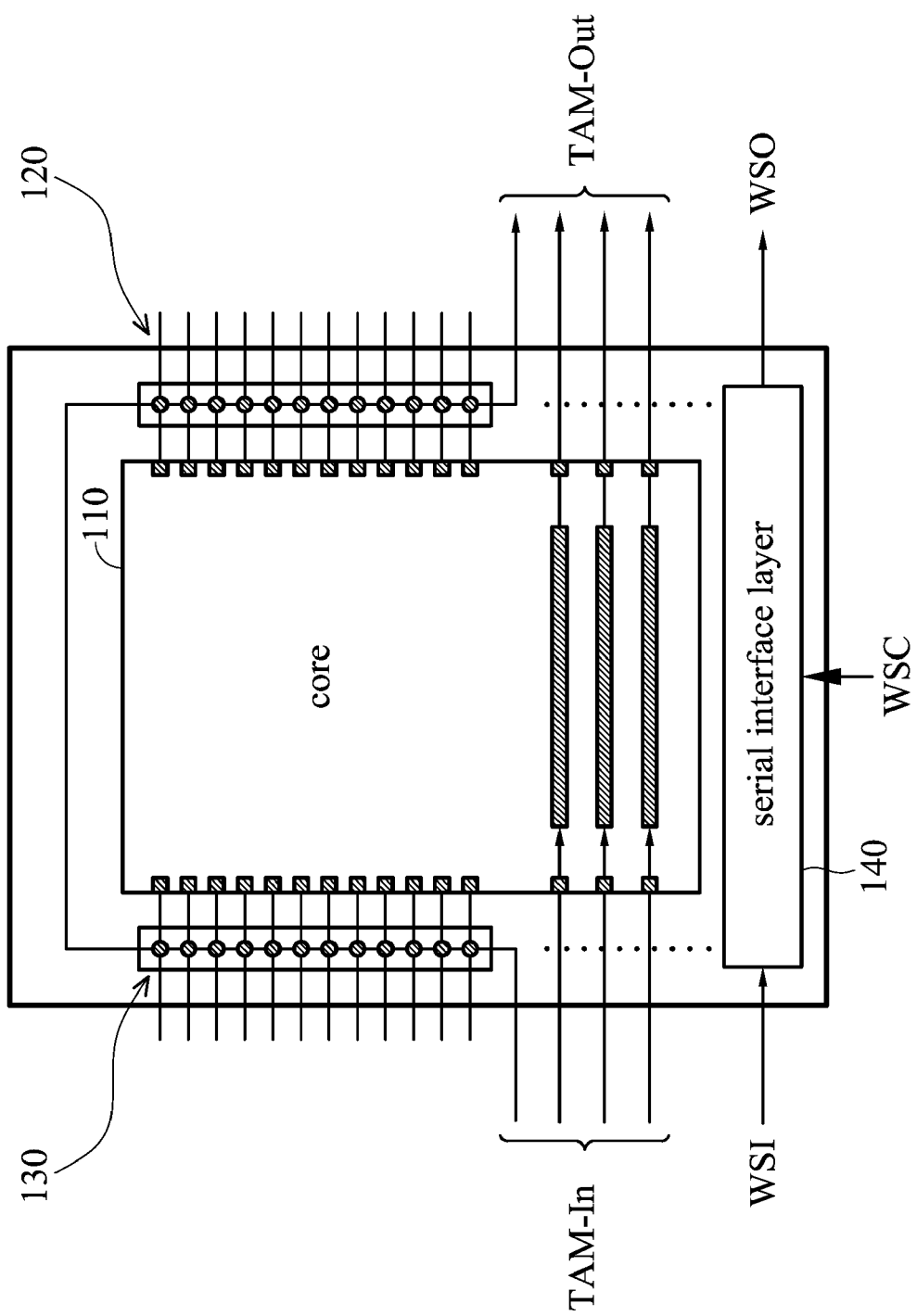
FIG. 1 is a schematic view showing the architecture of an IEEE 1500 standard test wrapper.
Figure 2:
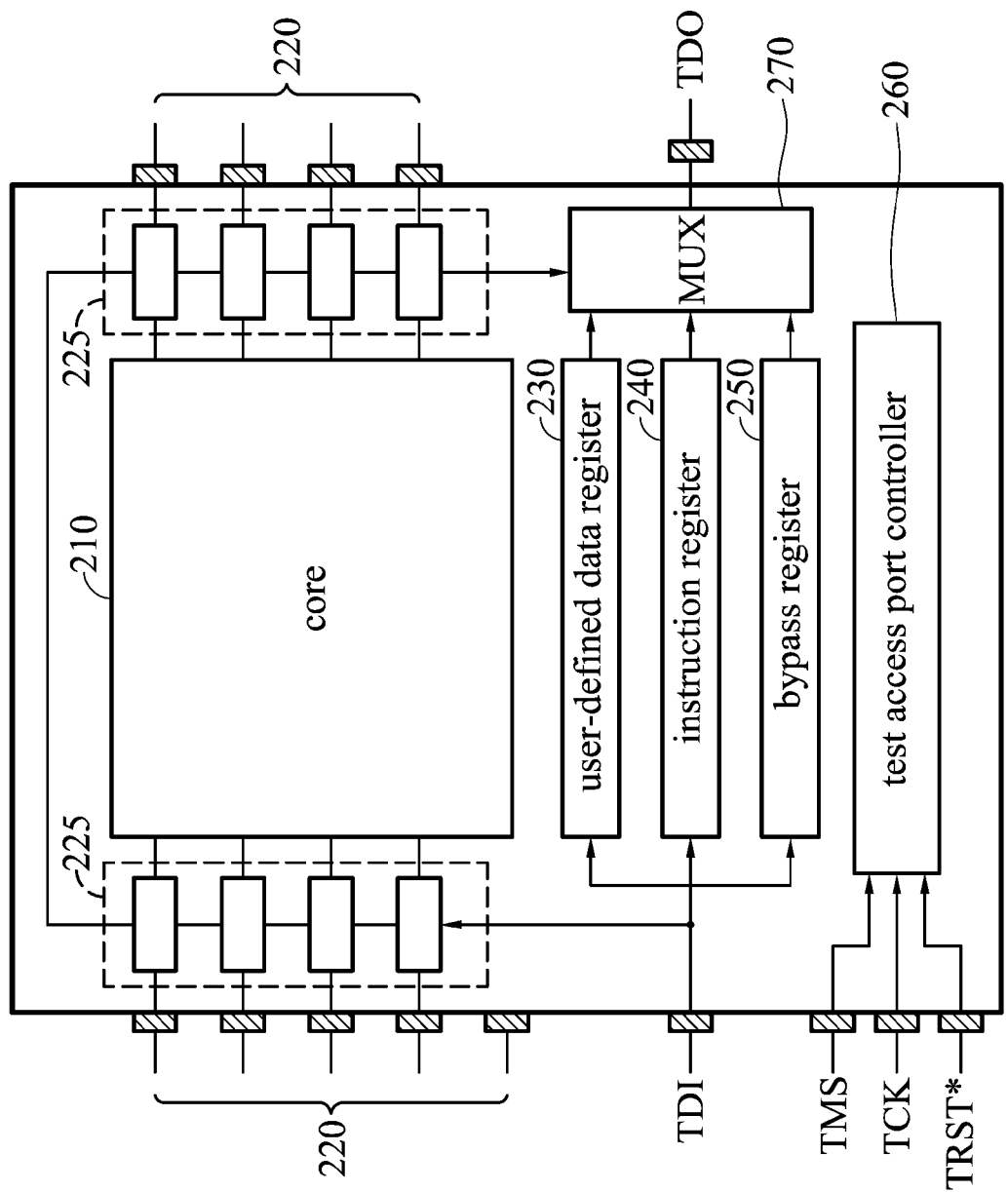
FIG. 2 is a schematic view showing the architecture of an IEEE 1149.1 standard test access port and boundary scan.

Several exemplary embodiments of the invention are described with reference to FIGS. 4 through 11. It is to be understood that the following disclosure provides various different embodiments as examples for implementing different features of the invention. Specific examples of components and arrangements are described in the following to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various described embodiments and/or configurations.

The invention discloses a test device and method for a hierarchical test architecture.

A test controller of the present invention can control the test wrapper of a System-on-a-Chip in compliance with the IEEE standard 1149.1 and 1500. The test controller contains a test access port (TAP) finite state machine (FSM) in compliance with the IEEE 1149.1 standard for controlling test processes within all ICs, and adds new control signals, hierarchical test instructions and new test processes to the test controller in order to be compatible with the IEEE 1500 standard test processes without changing the standard finite state machine. In addition, a hierarchical testing function is provided.

The test controller in the test device receives the TAP test signals in compliance with the IEEE 1149.1 standard provided by the outer portion of the chip, and generates test control signals for controlling level 0 data registers. The TAP test signals comprise a test data in (TDI) signal, a test data out (TDO) signal and the test control signals. The test control signals comprise a test mode select (TMS) signal, a test clock (TCK) signal and an optional test reset (TRST) signal.

The test controller can also generate test control signals in compliance with the IEEE 1500 standard for wrapper serial control signals. The wrapper serial control signals comprise a wrapper clock (WRCK) signal, a wrapper reset (WRSTN) signal, a shift wrapper register (ShiftWR) signal, a capture wrapper register (CaptureWR) signal, an update wrapper register (UpdateWR) signal, a select wrapper instruction register (SelectWIR) signal and so on. The test controller contains a TAP controller in compliance with the IEEE 1149.1 standard for controlling the test process and test data path, and a hierarchical core test instructions (ex. Core_Test) and a control signal register are also added to the test controller.

Figure 4A:
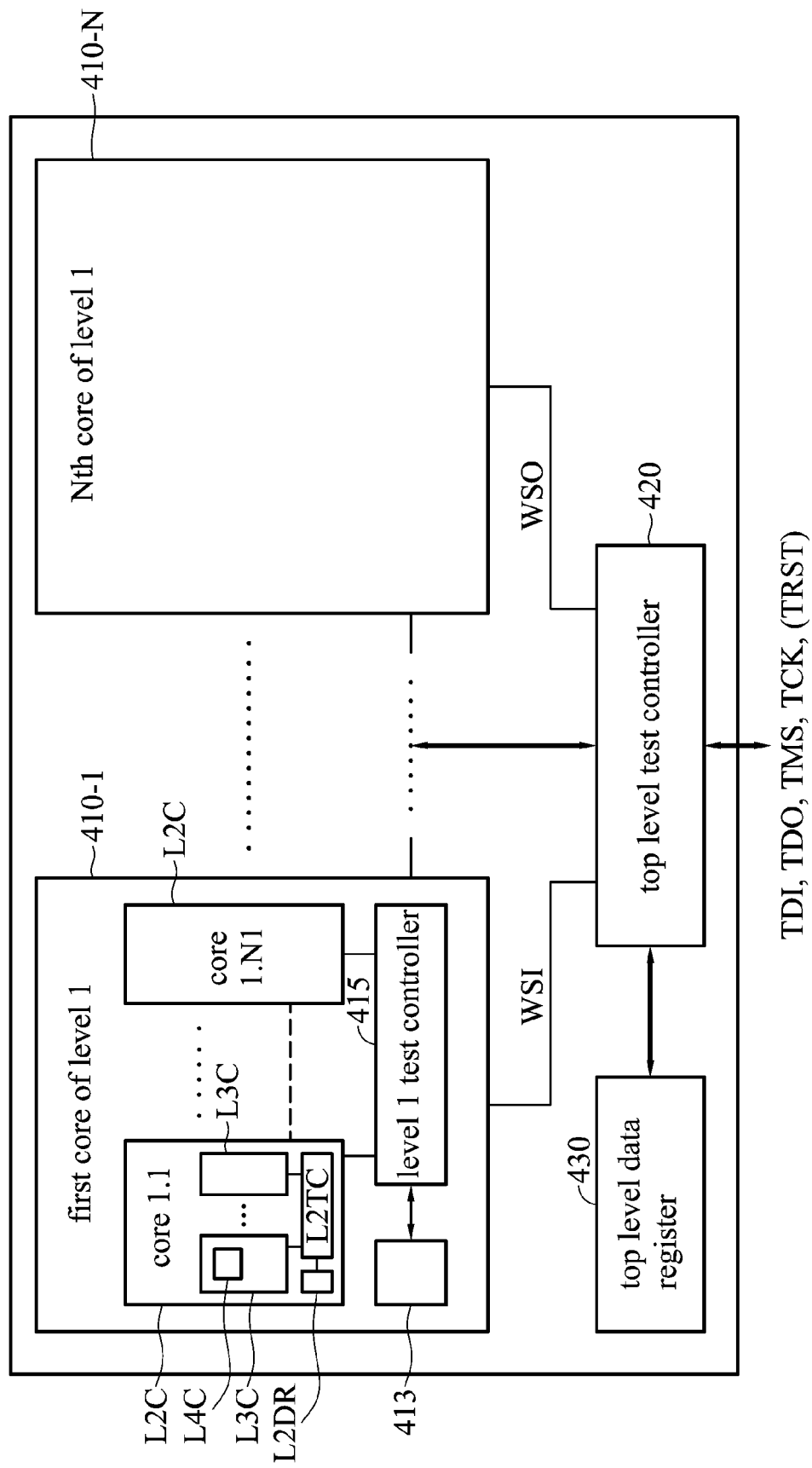
FIG. 4A is a schematic view of a test device of a hierarchical test architecture of an embodiment of the present invention.

FIG. 4A is a schematic view showing the architecture of the test device of the hierarchical test architecture mixed with the IEEE standard 1149.1 and 1500 of an embodiment of the present invention. The test device can control the test wrapper in compliance with the IEEE 1149.1 standard and IEEE 1500 at the same time.

The test device is composed of at least one core (410-1 . . . 410-N), a level 0 test controller 420 and a level 0 data register 430. The core of the level 1 test layer can be a hierarchical test circuit or the core wrapped with a test wrapper in compliance with the IEEE standard 1149.1 or 1500. If the core is a hierarchical test circuit, such as the first core of the level 1 in FIG. 4A (in which the level 1 data register (indicated as L1DR) 413 is used to record the test data of the level, and the level 1 test controller 415 is used to control test processes), then one or more cores of the level 2 test layer can be added to the core (1.1..1.N1, indicated as L2C). As shown in FIG. 4A, when one of the cores in the core of the level 2 test layer is a hierarchical test circuit (such as the core 1.1), then in the level 2 test layer, the level 2 test controller (L2TC) is used to control the test processes, and the level 2 data register (L2DR) is used to record the test data (Similar to level 1 test architecture). Meanwhile, the one or more test levels of the level 3 test layer (indicated as L3C) can be added to the core. In the level 3 test layer, if the core is the hierarchical test circuit, then the core further comprises one or more cores of the level 4 test layer (indicated as L4C). Similarly, when the core of any level is a hierarchical test circuit, then one or more cores of next level test layer are added to the core until no more cores of the level is a hierarchical test circuit.

When one test layer is composed of multiple cores, then all of the cores are connected in series. Specifically, for the test layer, each test data output of the core is connected to the test data input of the next core other than the first and the last core. The test data input of the first core is connected to the wrapper serial input (WSI) port of a previous level test controller, and the test data output of the last core is connected to a wrapped serial output (WSO) port of a previous level test controller.

The level 0 data registers comprises at least a boundary-scan register and a bypass register, and one or more user-defined registers can be added as required. The level 0 test controller receives the test control signals, TMS, TCK, and optional TRST, and receives test data from the level 0 TDI port to the instruction register of the level 0 controller or the level 0 data register. By receiving the test control signals from the level 0 input ports of TMS, TCK, and optional TRST, and the state value of the TAP state register, the test controller can generate two sets of test control signals, wherein the first set of test signals comprises Clock-DR, Shift-DR, Capture-DR, Update-DR and so on to control the level 0 data register and the level 0 test processes, called CS1. The second set of test signals are WSC test control signals for controlling a test wrapper in compliance with IEEE 1500 standard, wherein the signals combined with the control signals such as TMS, TCK are referred to as a CS2 for controlling each test processes of the core of the next level test layer. When the cores are wrapped with the wrapper in compliance with the IEEE 1149.1 standard, the control signal TMS and TCK are directly connected to the input port of the TMS and TCK in level 0. When the core is wrapped with the wrapper in compliance with the IEEE 1500 standard, the control signals are WSC. Whether the test data output port (TDO) is connected to the test data output (WSO) of the core or the test data output of level 0 data registers are determined by the instruction which is stored in the instruction registers and decoded by the instruction decoder. The instruction decoder determines which data register will output the test data or output the test data from the WSO connected to the core based on the instruction code.

Note that when the level 0 test layer only has one core, the core needs to have the hierarchical test architecture of the embodiment of the present invention. Each level of the test layer which is similar to the level 0 test architecture may comprise multiple cores of the next level (i.e. tree architecture) other than the final level test layer having a core which is the wrapper in compliance with the IEEE standard 1149.1 or 1500.

In the hierarchical test architecture shown in FIG. 4A, the number of cores is not a fixed number and the number of the test layers is also not a fixed number.

In each test layer, if the next level test layer exists, then at least one of the cores must be the hierarchical architecture and all the other cores can be the cores in compliance with the IEEE standard 1149.1 or 1500. If there is no any core that contains a hierarchical architecture, then it is called the last level test layer.

When the level 0 only has one core, the core of the level 0 must contain a hierarchical architecture and test controller. When the level 0 has only one core without a hierarchical test architecture, a standard test architecture in compliance with the IEEE standard 1149.1 can be used as the test architecture of the level 0. Therefore, the hierarchical test architecture needs to have at least two test layers (level 0 and level 1), wherein the level 1 needs to have at least two cores or only one core but with the hierarchical test architecture.

Only the level 0 needs to have a hierarchical test controller, the core of the level 1 and the layer after the level 1 may comprise the core in compliance with the IEEE 1149.1 standard, IEEE 1500 standard or the hierarchical test architecture. In addition, each layer can be composed of one or a multiple (not a fixed number) number of cores.

Figure 4B:
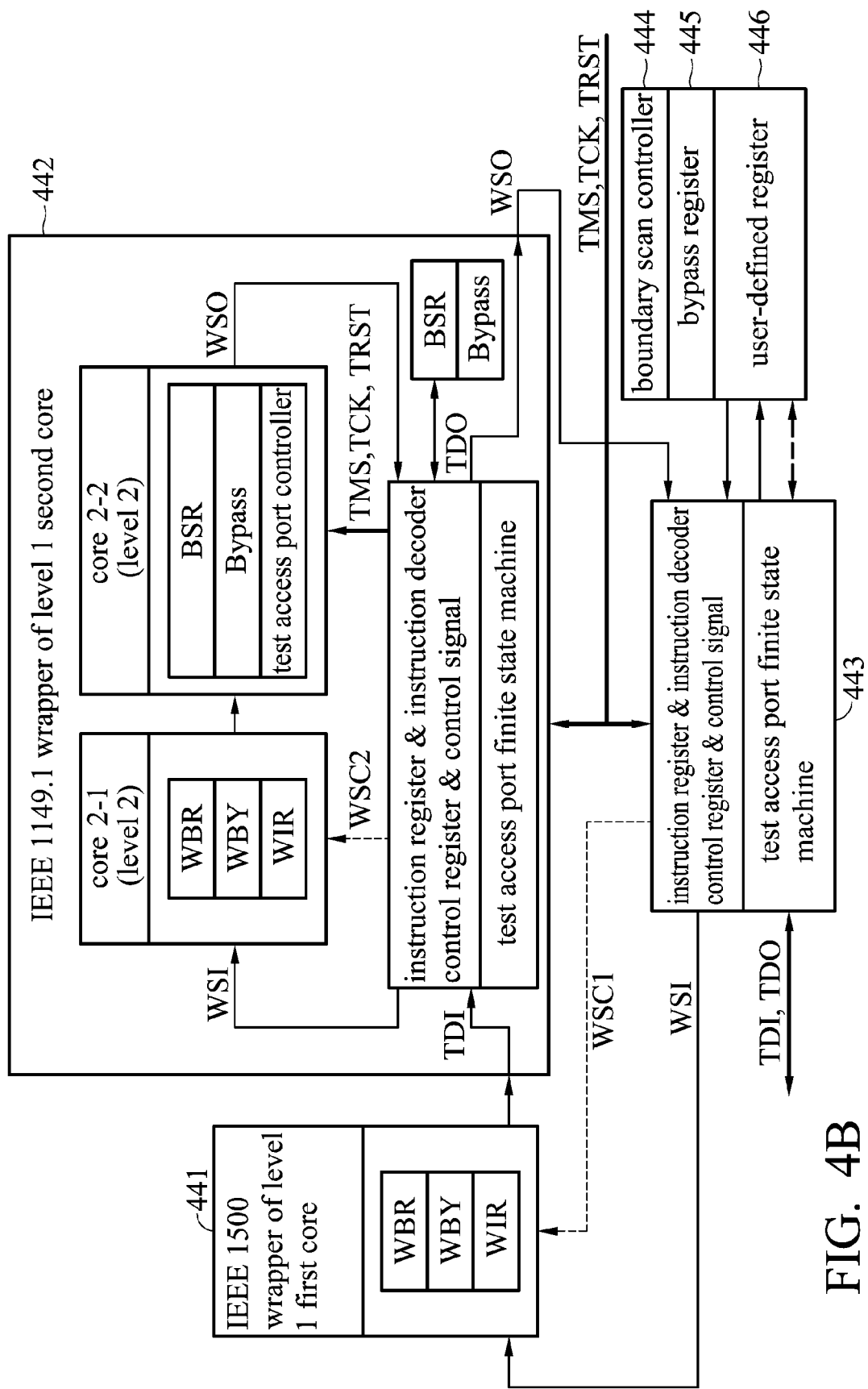
FIG. 4B is a schematic view for explaining control signal connections in the test architecture of the embodiment of the present invention.

FIG. 4B is a schematic view describing the connection of the control signals in the test architecture of the embodiment of the present invention.

The test architecture is composed of a level 0 hierarchical test controller, level 0 data registers and a level 1 test layer. The level 0 hierarchical test controller is composed of an instruction register, an instruction decoder, a control signal register, a data register, control signals and a test access port finite state machine 443. The level 0 data register comprises a boundary-scan register (BSR) 444, a bypass register 445 and one or more optional user-defined registers 446.

The level 1 test layer is composed of an IEEE 1500 standard wrapper of the first core of the level 1 441 and IEEE 1149.1 standard wrapper of the second core of the level 1 442. The IEEE 1500 standard wrapper of the first core of the level 1 441 comprises a WBR, WBY, WIR, other data registers (not shown), and logic circuits for controlling the wrapper (not shown). The IEEE 1149.1 standard wrapper of the second core of the level 1 442 comprises a hierarchical test controller, a data register and the level 2 test layer. Similar to the level 0 hierarchical test controller, the level 1 hierarchical test controller is also composed of an instruction register, an instruction decoder, a control signal register, a data register, control signals and a test access port finite state machine. The data register comprise a bypass register and a boundary-scan register.

The level 2 test layer is composed of core 2-1 and core 2-2. The core 2-1 comprises a WBR, WBY and WIR. The core 2-2 comprises a BSR, Bypass and the test access controller (that is an IEEE 1149.1 test controller not a hierarchical test controller). If one of the cores in the level 2 test layer is the hierarchical test architecture, then the number of test layers can be increased, but the architecture can be the same as the described hierarchical test architecture.

The thin solid line indicates the output and input of intra test data, which is connected the WSI port of a hierarchical test controller to the WSI or TDI of the first core of the next level, the WSO or TDO of the last core of the next level to the WSO port of the hierarchical test controller, or the WSO or, TDO ports of a core to the WSI or TDI of the core that is next to the previous one. The thick solid line indicates that the test signals are directly connected to the I/O ports of the chip which comprises TDI, TDO, TMS, TCK, and the optional TRST (all TAP signals). The thin dashed-line indicates the test control signals of the inner cores which are WSC control signals, wherein each the hierarchical test controllers of the cores that have the hierarchical test architecture need to individually generate a set of WSC control signals to control the IEEE 1500 standard test wrappers of the cores of a next level. The thick dashed-line indicates the inner control signals generated by the test controller, comprising a Shift-DR, Capture-DR, Update-DR and other test control signals, to control the data registers of this level.

Figure 4C:
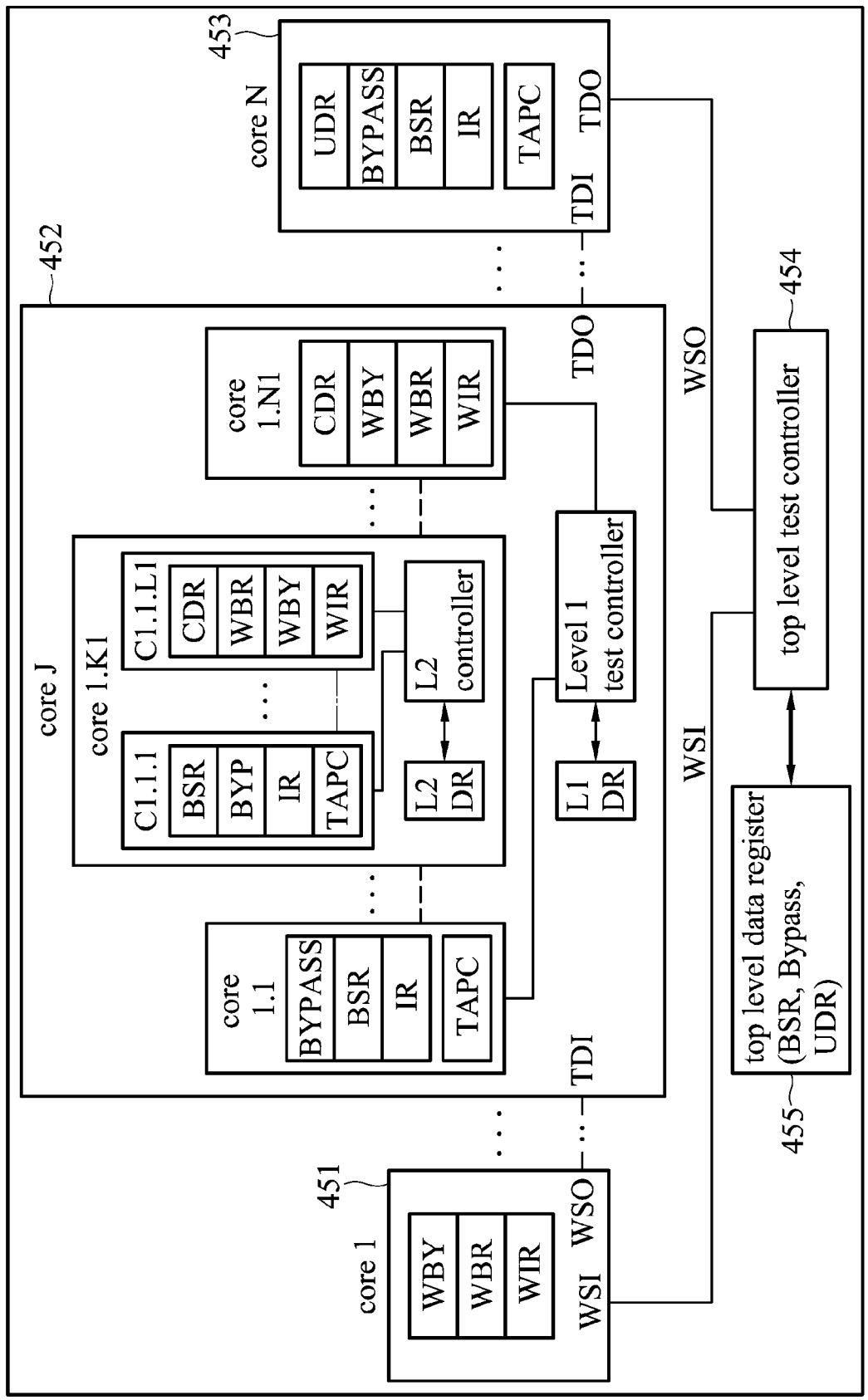
FIG. 4C is a schematic view of the test device of the hierarchical test architecture of another embodiment of the present invention.
Figure 4D:
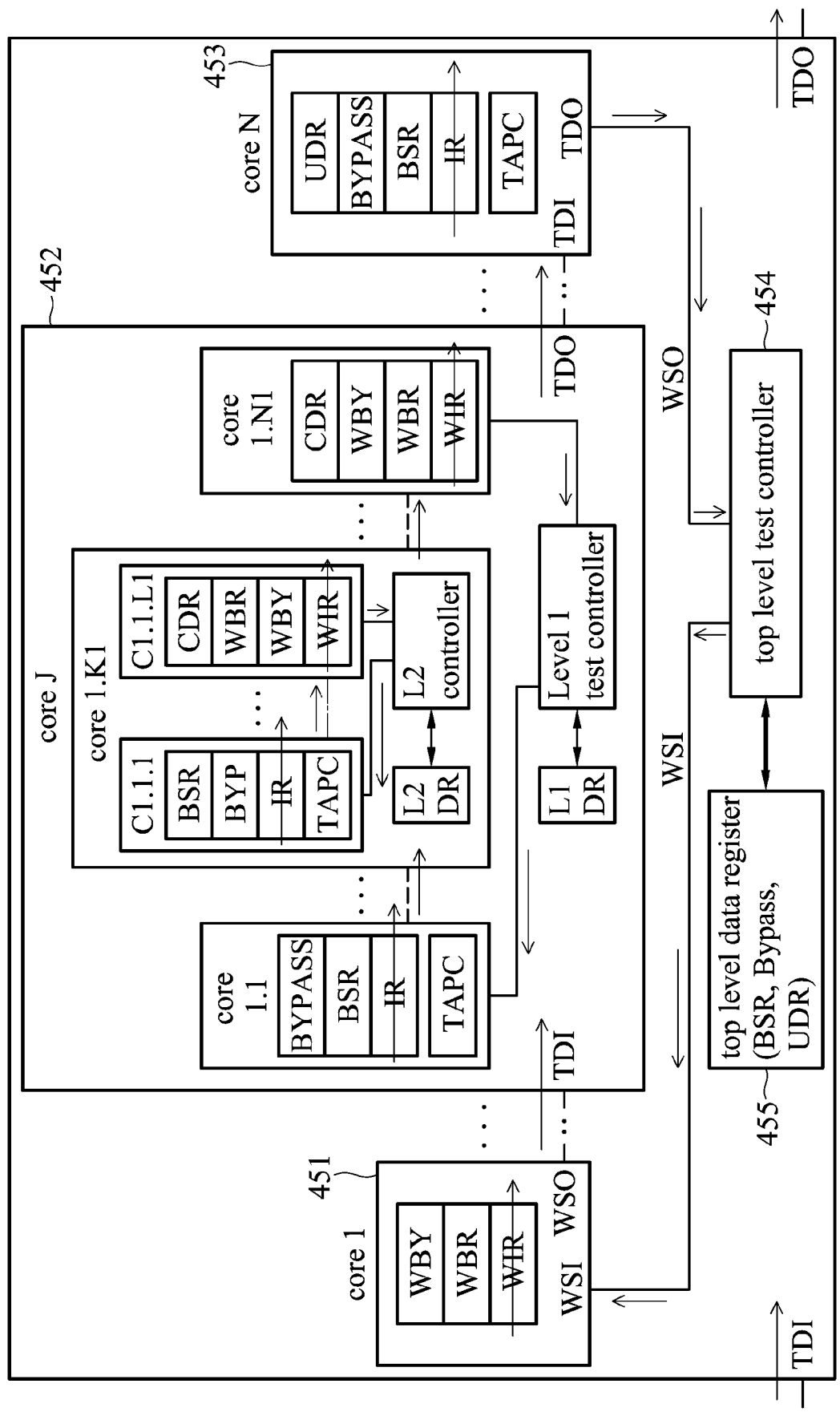
FIG. 4D is a schematic view for explaining control signal connections in the test architecture of FIG. 4C during the operation flow of the instruction registers of the present invention.
Figure 4E:
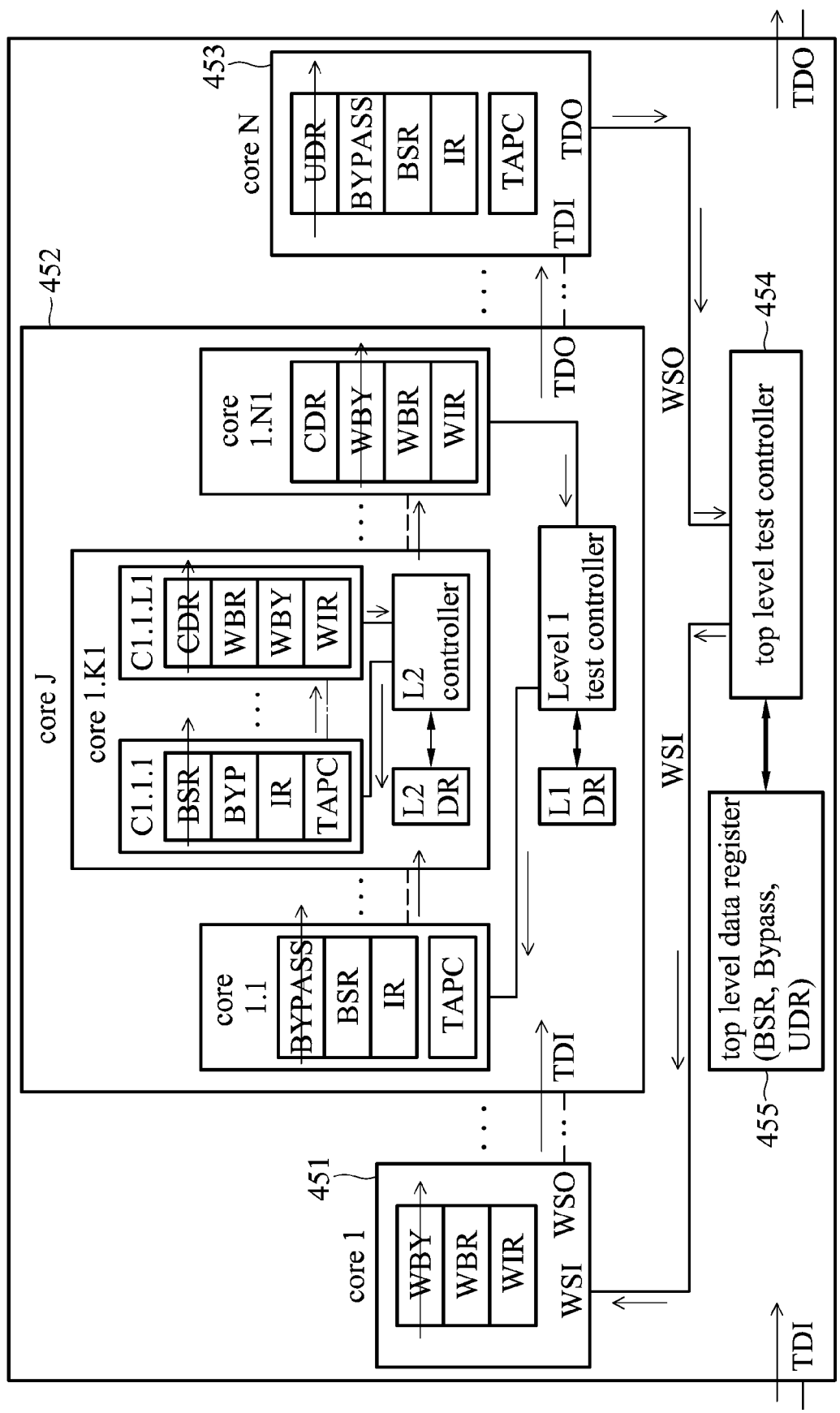
FIG. 4E is a schematic view for explaining control signal connections in the test architecture of FIG. 4C during the operation flow of the data registers of the present invention.

Note that in FIG. 4C-4E, each core also comprises a WBR, WBY, WIR, CDR, BSR and so on, however, detailed descriptions are omitted for brevity.

FIG. 4C is a schematic view showing the architecture of the test device of the hierarchical test architecture. A user-defined register and CDR are non-standard data registers defined by the user for storing the test data.

FIG. 4D is a schematic view describing the connection of the control signals in the instruction register operation flow. The arrows stand for the test data flow. During the operation flow of the instruction register, the instructions from the outer TDI pass through the TDI of the test controllers of each level to the IRs/WIRs of the cores of the level that needs to be tested and is output through the outer TDO port. Note that during the operation flow of the instruction register, output data is meaningless.

FIG. 4E is a schematic view describing the connection of the control signals in the data register operation flow. In the data register operation flow, the test data from the outer TDI passes through the TDI of the test controllers of each level to the BSR, BYPASS, UDR, WBR, WBY, or CDR of the cores that need to be tested, and is output through the outer TDO port. During the data register operation flow, the test data stored in the WBY or BYPASS register is meaningless and for bypassing the core.

The hierarchical test wrapper of the embodiment is composed of the TAP controller in compliance with the IEEE 1149.1 standard, a set of standard TAP I/O ports, an N-bit instruction register, an instruction decoder, a 1-bit bypass register, and a boundary-scan register.

The data inputs of the instruction register, the boundary-scan register and the bypass register in the wrapper are connected to the TDI port of the wrapper, wherein the outputs of the boundary-scan register and the bypass register are connected to the input of the instruction decoder, and the output of the instruction decoder is connected to the input of a multiplexer, wherein the other input of the multiplexer is connected to the output of the instruction register, and the output of the multiplexer is connected to the TDO port of the wrapper.

The test controller is composed of a standard TAP finite state machine with 16 different states, a copy of the state register, a control signal (i.e. Wrapper-Enable) which can control the operation of the wrapper of the next level, a control signal (i.e. SelectWIR) which can control whether the instruction register should operate or not, some control signal for controlling the registers including the instruction register and the data registers, and some logic circuits for generating these control signals.

Figure 3:
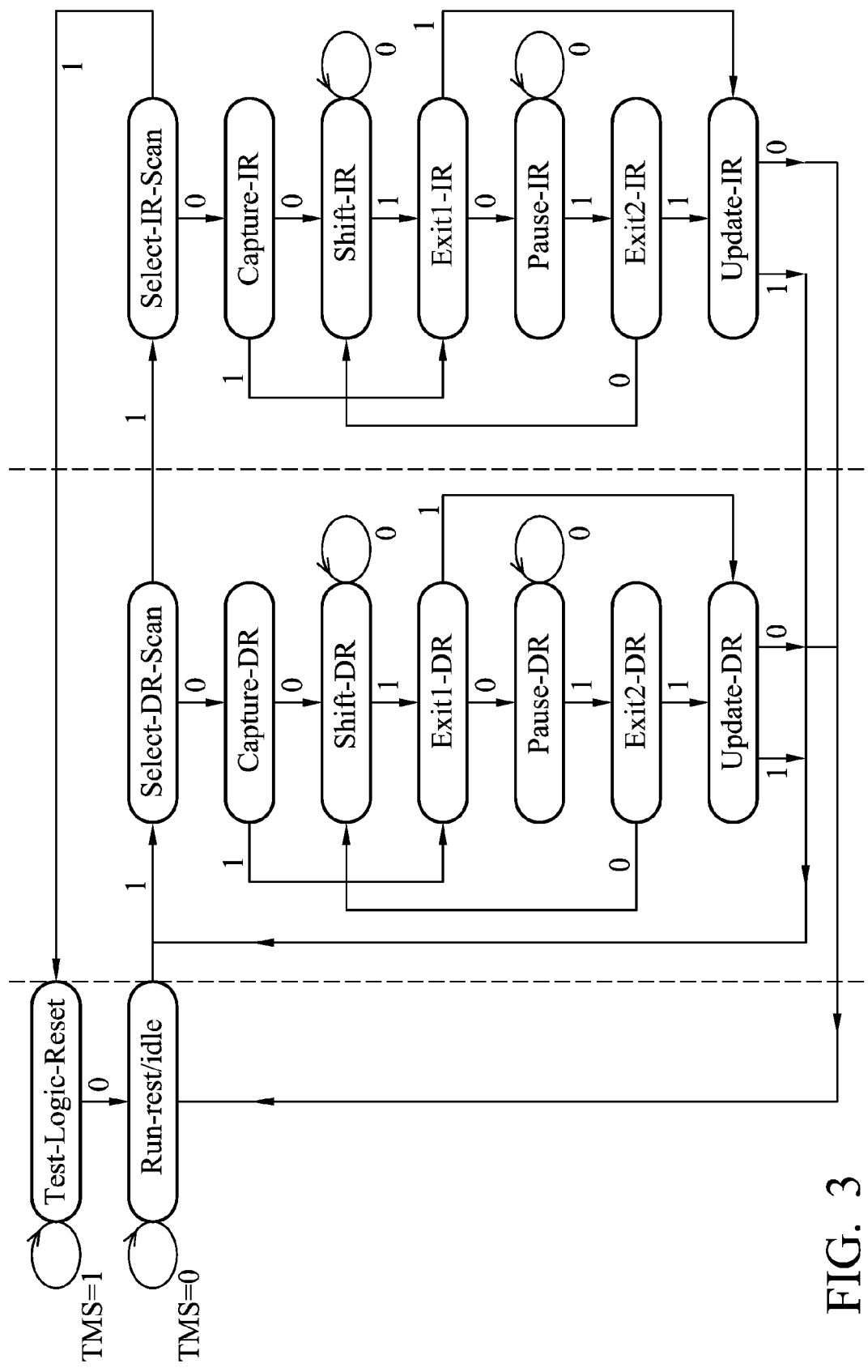
FIG. 3 is a state diagram showing a finite state machine within a TAP controller of the related art.

The standard TAP finite state machine is composed of a 4-bit state register, which logic value stands for current state of the TAP finite state machine, and the total state number is 16 as shown in FIG. 3. The 16 states can be partitioned into three different categories. The first type of states is composed of test logic-reset and run-test/idle state, wherein the test logic-reset state is used to reset the test controller and the run-test/idle state is keeping the test controller idling. Under the states, all data registers (such as the bypass register, boundary-scan register, and user-defined register) will not operate. The second type is control of the data register, comprising seven states including a select-DR-scan, Capture-DR, Shift-IR, Update-DR and so on, which mainly controls when the test data of the outer TDI port is input to the data register or when the test data of data register is output to the outer TDO port. The described process is also called data register operation. The third type is control of the instruction register, comprising seven states of a select-IR-scan, Capture-IR, Shift-IR, Update-IR and so on, which mainly controls when the test data of the outer TDI port is input to the instruction register. The described process is also called instruction register operation.

When the TCK inputs to the test controller, since not all of the states of the TAP finite state machine correspond to the data register or instruction register, that data register or instruction register need to receive the data only in some states. In the test controller, there are two clock signals Clock-DR and Clock-IR, respectively. When the TAP finite state machine enters the four states, Capture-DR/Shift-DR or Capture-IR/Shift-IR states, the test controller allows the data register or instruction register to capture and shift the test data. When the TAP finite state machine enters Update-DR or Update-IR states, the test controller allows the data register or instruction register to update the test data. When the TAP finite state machine in the test controller enters the two states, Capture-DR and Shift-DR, the Clock-DR signal will synchronous with the outer test clock (TCK) signal, otherwise the Clock-DR will maintain the logic 1. Similarly, when the TAP finite state machine enters the Capture-IR or Shift-IR states, the Clock-IR signal will synchronous with the test clock (TCK), otherwise the Clock-IR will maintain the logic 1.

For signals in compliance with the IEEE 1500 standard, the CaptureWR signal in the test controller is obtained by performing a logic OR operation on the Capture-IR signal and the Capture-DR signal, the ShiftWR signal is obtained by performing a logic OR operation on the Shift-IR signal and Shift-DR signal, the UpdateWR signal is obtained by performing a logic OR operation on the Update-IR signal and Update-DR signal, and the WRCK signal is obtained by performing a logic AND operation on the Clock-DR signal and Clock-IR signal. In addition, a logic AND operation is performed on the ShiftWR, CaptureWR, and UpdateWR signals of the test controller and the Wrapper-Enable signal, and a logic OR operation is performed on the WRCK signal of the test controller and the inversion of the Wrapper-Enable signal before the signals are connected to each test wrapper in compliance with the IEEE 1500 standard. Therefore, the signals can work only when a test is being conducted on the wrapper, otherwise, the signals are held at 1 (WRCK) or 0 (ShiftWR, CaptureWR, UpdateWR). The signals Shift-DR, Shift-IR, ShiftWR, Capture-DR, CaptureWR each have a corresponding register which is triggered by a falling edge, and the corresponding register will be set to 1 when the TAP finite state machine enter the states. For example, when the finite state machine enters the Shift-DR state, the Shift-DR register will be set to 1 at the time the test clock (TCK) changes from 1 to 0.

The TMS port is set to a logic value at the falling edge of TCK signal, wherein the TAP finite state machine within the test controller is set based on the value at the rising edge of the TCK signal. Therefore, the test controller can not compare the value of the state register (as the value is changing) and the logic value of the TMS at the same time at the rising edge of the TCK signal. In order to compare the value of the state value and the value of the TMS at the rising edge of the TCK signal, the value of the state register is copied to a 4-bit register (i.e. the CurrentState register) when the TCK is at the falling edge. The value of the state register and the value of the TMS can be compared by the test controller at the rising edge of the TCK signal to determine whether the control flags are to be enabled or disabled. After the comparison (after a half of test clock cycle), the register of the corresponding control flag will be set by the controller at the falling edge of the TCK signal when the control flag needs to be enabled or disabled.

An instruction decoder is connected to the output port of the instruction register for receiving the instruction value of the instruction register and setting which data register connected to the standard test output port of the test controller by a multiplexer based on the received instruction. The WSO port is output to the TDO port optionally by the multiplexer when the received instruction is a hierarchical test instruction.

The instruction register is composed of the instruction shift register and the instruction update register. Under normal operation of the instruction register, the TAP finite state machine is in a Shift-IR state, and the test instruction is entered from the outer TDI port to the instruction shift register in sequence. The value of the instruction shift register is stored to the instruction update register when the TAP finite state machine is in the Update-IR state. The flow described is the operation flow of the instruction register.

Following is a description of the test flow when using a hierarchical test instruction. If the value of the instruction update register is the hierarchical test instruction, the instruction register will be disabled by the test controller by using the control signal (SelectWIR) to control the instruction register when the state register changes from the Select-DR-Scan state into the Select-IR-Scan state, and then the test instructions inputted by the TDI are received by the instruction register of the test wrapper of the next level. The value stored in the instruction register of the level is held unchanged until the end of this test when the instruction register is disabled. Disabling the instruction register is executed by one of the following operations. An OR logic operation on the SelectWIR signal and the Clock-IR signal is performed and the clock of the instruction shift register remains unchanged, or an NOT operation is first performed on the SelectWIR signal and then an AND operation with the Shift-IR signal is performed, and the test instructions inputted by TDI are not allowed to be received by the instruction register of this level, and allowed to be received by the instruction registers of the test wrappers of the next level.

The SelectWIR signal is enabled when the value stored in the instruction register is a hierarchical test instruction and the state register is changed from the Select-DR-Scan state into the Select-IR-Scan state. The Wrapper-Enable signal is enabled when the value stored in the instruction register is a hierarchical test instruction, the SelectWIR signal is enabled, and the state register is changed from the Select-IR-Scan state into the Capture-IR state. The SelectWIR signal is disabled when the state register is changed from the Select-DR-Scan state into the Capture-DR state. The Wrapper-Enable signal is disabled when the SelectWIR signal is disabled, and the state register is changed from the Select-IR-Scan state into the Capture-IR state.

For a real circuit, the method for detecting the state change from the Select-DR-Scan state into the Select-IR-Scan state assumes the value stored in the CurrentState register is the current state. When the controller detects that the value stored in the CurrentState register is at the Select-DR-Scan state at the rising edge of the test clock (TCK) and the TMS is 1, which indicates the rising edge of the test clock, the state of the state register of the controller is changed from the Select-DR-Scan state into the Select-IR-Scan state and held at the Select-IR-Scan state before the test clock cycle enters a next rising edge.

The SelectWIR signal is enabled when the value stored in the instruction register is a hierarchical test instruction, and then the Wrapper-Enable signal is enabled when the state register is changed from the Select-IR-Scan state into the Capture-IR state. The SelectWIR signal is disabled when SelectWIR signal is enabled and the state register is changed from the Select-DR-Scan state into the Capture-DR state, and then the Wrapper-Enable signal is disabled when the state register is changed from the Select-IR-Scan state into the Capture-IR state and the value stored in the instruction register is still a hierarchical test instruction until the end of the next instruction register operation.

Since the test controller of each level takes the Wrapper-Enable signal and the SelectWIR signal as the signal for enabling or disabling the data registers and the instruction registers of the next level when performing the hierarchical test. Therefore, the signals are enabled only when the instruction register of the hierarchical test controller of the level is set to a hierarchical test instruction. The signals of the hierarchical test controller of all levels are disabled at the end of the test, and the instruction register and the data register of all levels other than the highest level are disabled. Next, the instruction register of the highest level is enabled and ready to receive the next test instruction.

The control signal for controlling the operation of the instruction register is connected to the SelectWIR control signal port of the wrapper and controls the instruction register of the wrapper when the wrapper is in compliance with the IEEE 1500 standard.

In the hierarchical test structure of the embodiment of the invention, the Level 0 controller is assumed as the highest level, in the order of the level 1, Level 2, . . . , Level n, wherein the number of the levels is not limited. The test controllers of the cores of all the levels are all IEEE 1149.1 standard TAP controller, but the instructions and the registers are designed based on the test requirements of the core under test.

In order to control the IEEE 1500 standard wrapper and the IEEE 1149.1 standard hierarchical test circuit, one OR gate of the clock signal of the control instruction register is added to the test controller. Whether new instructions can be inputted into the instruction register or not is controlled by the IEEE 1500 standard SelectWIR control signal. The Wrapper-Enable control signal is used to enable/disable the IEEE 1500 standard test wrapper and the IEEE 1149.1 standard hierarchical test circuit.

Figure 5:
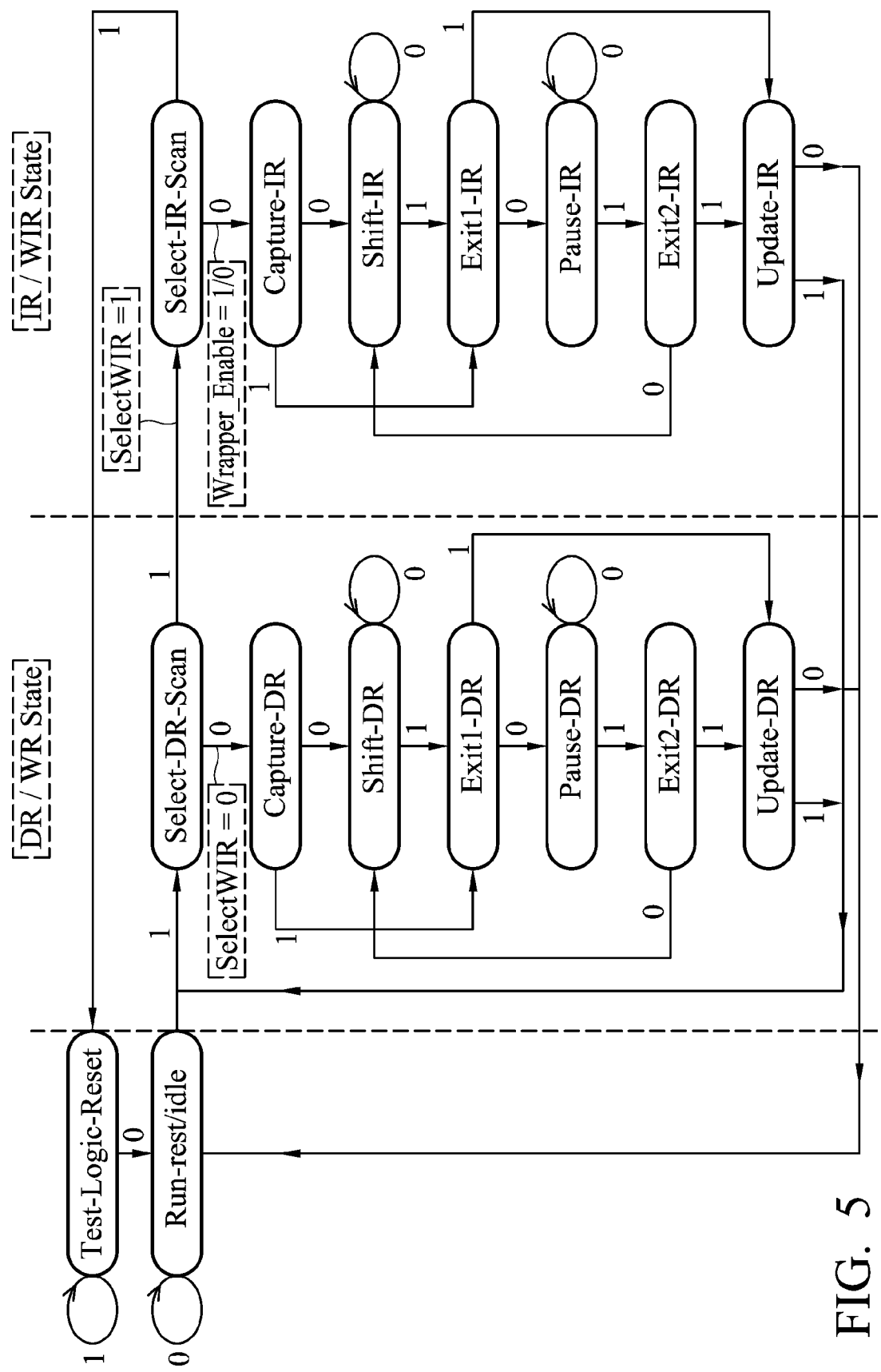
FIG. 5 is a state diagram showing a finite state machine and changing of the control signals within a TAP controller of the hierarchical test controller of the embodiment of the present invention.

In addition, for the IEEE 1500 standard, since whether the test instruction can be inputted into the instruction register of the core or not is controlled by the SelectWIR signal, whether the TAP test controller is in the data register operation flow or the instruction register operation flow can be distinguished by the SelectWIR signal for the IEEE 1500 standard test wrapper, as shown in FIG. 5.

Figure 6A:
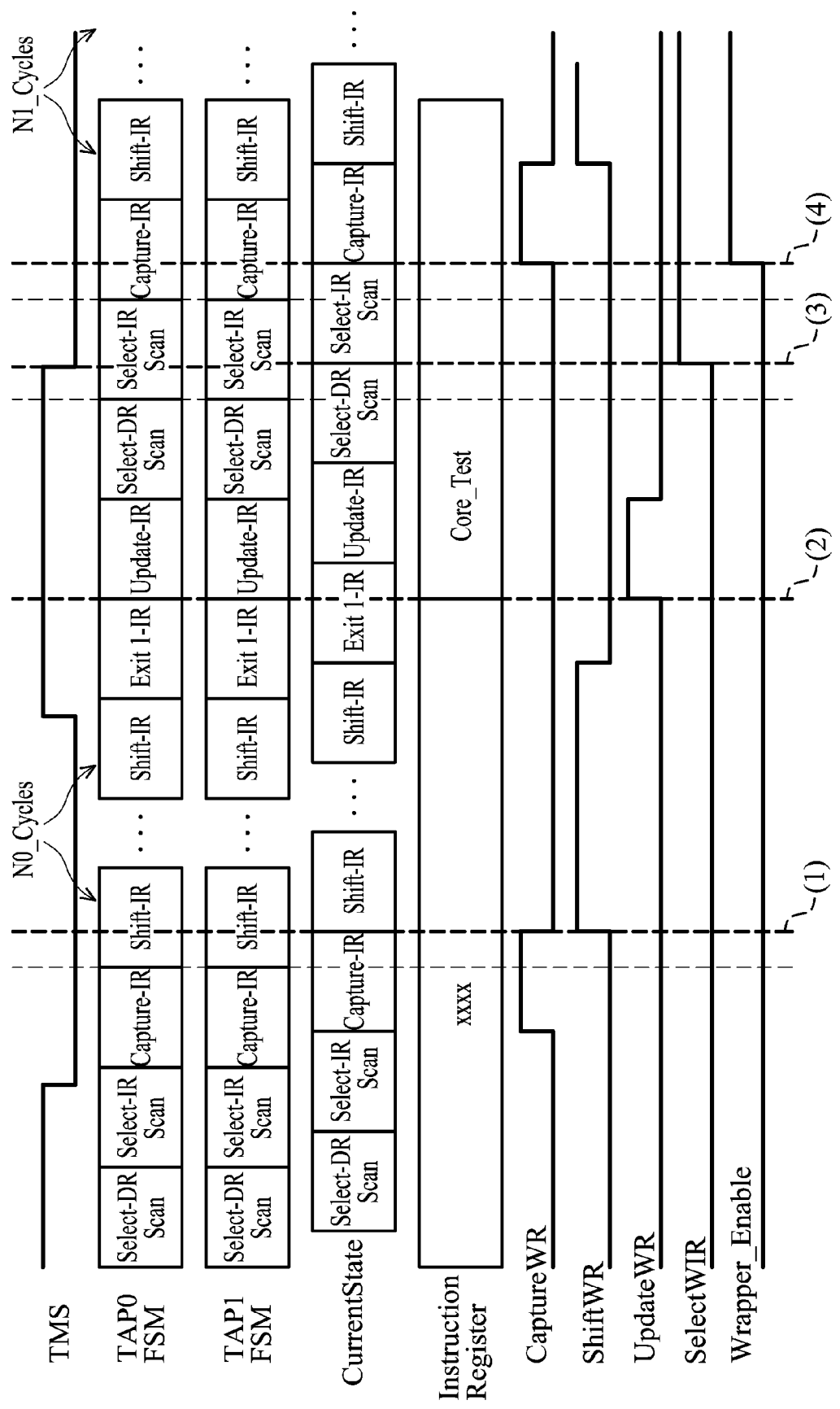
FIG. 6A~6C is a timing diagram of signals in the hierarchical test controller of the embodiment of the present invention.
Figure 6B:
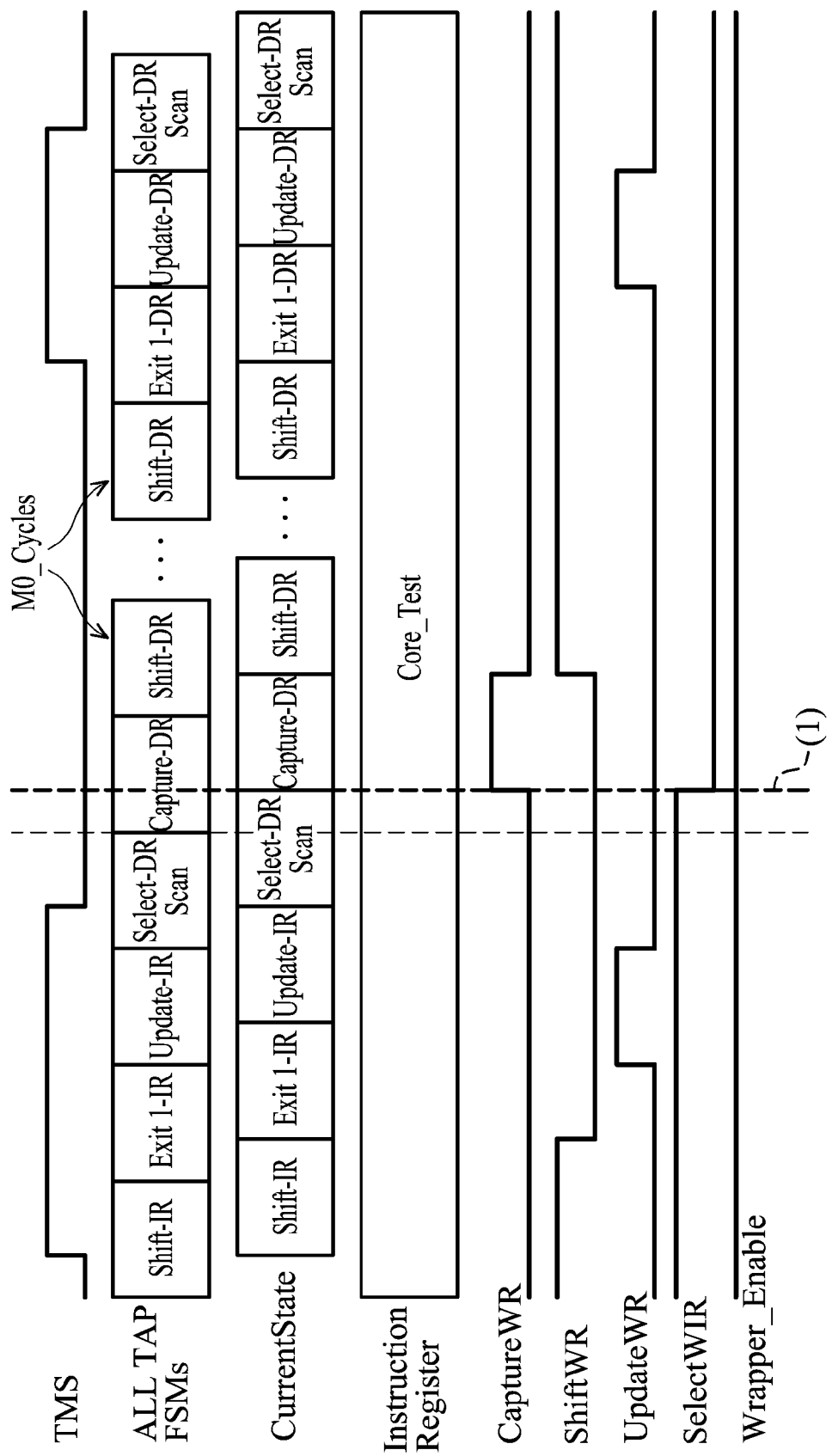
Figure 6C:
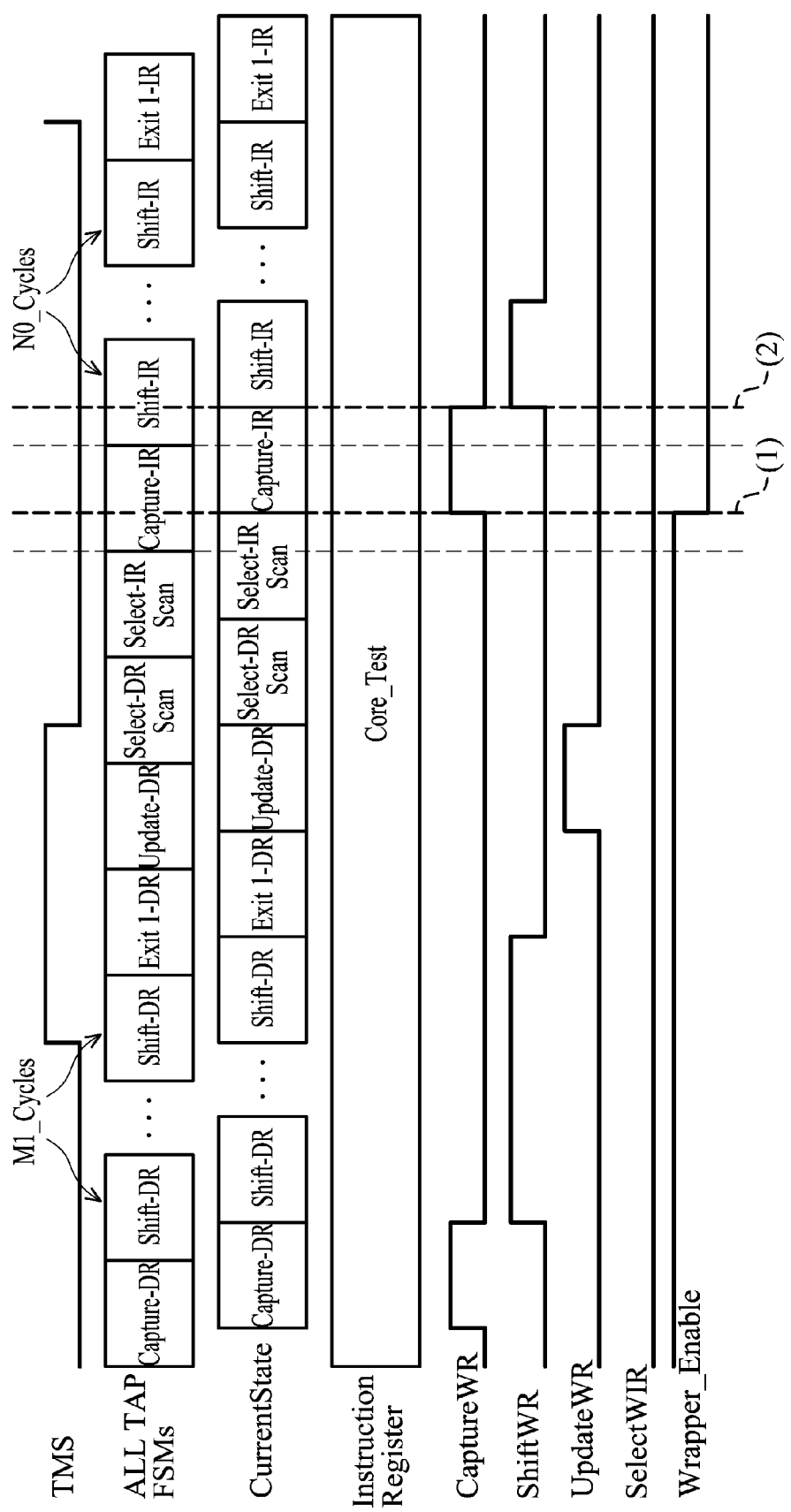

FIG. 6A~6C is a timing diagram of signals in the hierarchical test controller of the embodiment of the present invention. The timing diagrams shown in FIG. 6A-6C are continuous timing diagram, showing the timing diagram of a part of the control signals of the hierarchical test controller and IEEE 1500 standard wrapper serial control (WSC) signals.

In FIG. 6A-6C, the value stored in the state register is changed at the rising edge of the test clock (TCK) by each TAP FSM (not shown), wherein each state indicates one test clock. Since the CurrentState register in FIG. 6A-6C indicates the state value copied at the falling edge of the test clock, the value in the CurrentState register is changed at the falling edge.

In FIG. 6A, the Core_Test (i.e. the hierarchical test instruction) instruction starts inputted when the signal arrives at the dotted line (1)(where the state of TAP FSM is entering the Shift-IR state, and the internal ShiftWR signal of the hierarchical test controller of the top level is changed to 1, but the external ShiftWR port of the test controller remains 0 since the Wrapper-Enable signal is not enabled), it needs N0 test clock cycles to shift the Core_Test instruction into an N0-bit instruction register, and then the instruction register is updated to the Core_Test instruction when the signal arrives at the dotted line (2) (where the state of TAP FSM is entering the Update-IR state, and the internal UpdateWR signal of the test controller is changed to 1, the external UpdateWR port of the test controller remains 0 since the Wrapper-Enable signal is not enabled), the SelectWIR signal is enabled when the signal arrives at the dotted line (3) (where the CurrentState of the hierarchical test controller of the top level is changed from Select-DR-Scan to Select-IR-Scan), which indicates that the data path has changed to the instruction register by the core, and the Wrapper_Enable signal is disabled when the signal arrives at the dotted line (4) (where the CurrentState of the hierarchical test controller of the top level is changed from Select-IR-Scan to Capture-IR), which indicates that the next test data can be received by the cores of the next level as the test instructions of these cores. In FIG. 6B, the SelectWIR signal is disabled after the instruction input is finished (it needs N1 test clock cycles for shifting the test instructions into the cores of the next level wherein the total number of bits of the instruction registers of these cores is equal to N1), and the execution of the test instructions is started when the signal arrives at the dotted line (1), it needs M0 cycles to shift the test data in and out the data registers of these cores for the first set of test data, and it needs M1 cycles for the second set of test data and so on. In FIG. 6C, the Wrapper_Enable signal is disabled and the test is terminated when the signal arrives at the dotted line (1) (where the execution of all the test instructions is finished, and the TAP FSM is entering the instruction register operation flow). The next test flow is started and a new test instruction is inputted when the signal arrives at the dotted line (2).

The two FSMs (TAP0 FSM and TAP1 FSM) in FIG. 6A show the concept that all FSMs in the hierarchical test architecture are in the same state. All TAP FSMs in FIG. 6B indicate all TAP FSMs (all FSMs are in the same state) in the hierarchical test structure. The thin dotted line indicates the timing to change the status of the control flag and the value of the TMS resulted from comparison by the controller, and the bold dotted line indicates the timing to change the status of the control flag and the value stored in the instruction register (having a half clock cycle difference there between).

In FIG. 6A-6C, Nx_Cycles and Mx_Cycles are the clock periods when entering the Shift-IR and Shift-DR state. That is, the Shift-IR state is held for an N0 clock cycle when first entered for inputting instructions. Here, the N0 is the length of the instruction register (bit number) of the highest level (level 0), N1 is the total length of the instruction registers (bit number) of all cores in the level 1 and so on. When there are two test levels in N1, N2,1 and N2,2 will be present. An instruction input is completed before every testing in the hierarchical test of the invention, since the test instruction is entered before testing. Therefore, the total clock cycle needed for entering the instruction is N0+N1 (the clock cycles of Shift-IR state) plus the total clock cycles of the other states such as two times of Update-IR, two times of Select-DR-Scan, . . . two times of Capture-IR, when testing the level 1 core.

The M0 and M1 indicate the number of test data needed to be inputted or outputted when testing the real cores. The testing is not limited to M0/M1, and the test data can be repeatedly inputted and outputted until the end of the test (that is M0, . . . , Mn and n>=0). In addition, it is possible that no data needs to be inputted. That is, the state is changed from Capture-DR state to Update-DR state directly without passing through Shift-DR state. Next, the new test instruction is inputted in the next instruction register operation flow and changed when the TAP FSM is at Update-IR state.

The SelectWIR signal is set to 1 after entering a predetermined hierarchical core test instruction (ex. Core_Test). Therefore, the instruction register in the TAP controller is disabled until the end of the entire test flow and thereafter prepares for entering of new instructions. After the instruction register is disabled, the hierarchical instruction stored in the instruction register remains unchanged until the end of this test. Every hierarchical test flow is composed of two or more instruction register operation flows (two instruction register operation flows are needed in testing the level 1 and three instruction register operation flow are needed in testing the level 2, and so on) and 0-N times data register operation flow. Every test level other than the level 0 (chip level) is composed of one or more cores, and each core is a circuit under test (CUT) wrapped with the IEEE 1149.1 or 1500 standard test wrapper, where in the core of the two standards can be combined on the same test serial (as shown in FIG. 4B). Every core is connected in turn from the first core to the last core.

The cores at the same level and connected to the same test controller are connected in serial and respective test instructions can be inputted in a same test flow. Therefore, the cores can be tested in parallel (i.e. in a same test flow). However, the cores connected to different controllers at the same level can not be tested in parallel.

The state register (the value stored is shown in FIG. 3) in the TAP controller is controlled by the test program using the TMS signal, the value stored in the state register is changed from the Select-DR-Scan state, passing the Capture-DR state, Shift-DR state, Exit1-DR state, Pause-DR state or Exit2-DR state, into the Update-DR state, wherein the flow described is referred to as one data register operation flow. If the value stored in the state register is changed from the Select-IR-Scan state, Capture-IR state, Shift-IR state, Exit1-IR state, Pause-IR-Scan state or Exit2-IR state, into the Update-IR state, the flow is referred to as one instruction register operation flow. If the state register changes from the Select-DR-Scan state into Select-IR-Scan state, it indicates that the test flow has ended.

When all instruction register operation flows are finished and the finite state machine of the test controller enters the data register operation flow, the state register is changed from the Select-DR-Scan state into the Capture-DR state. Therefore, the SelectWIR signal is disabled when the state register is in a Select-DR-Scan state and about to enter the Capture-DR state, which indicates that the test controllers or the test wrappers of the level that are tested have completed receiving the instructions and are ready for receiving the test data and executing real test tasks. Then, the test data received during all of the data register operation flows will not be inputted into the wrapper that is not being tested and only be inputted into the wrapper being tested.

Figure 7:
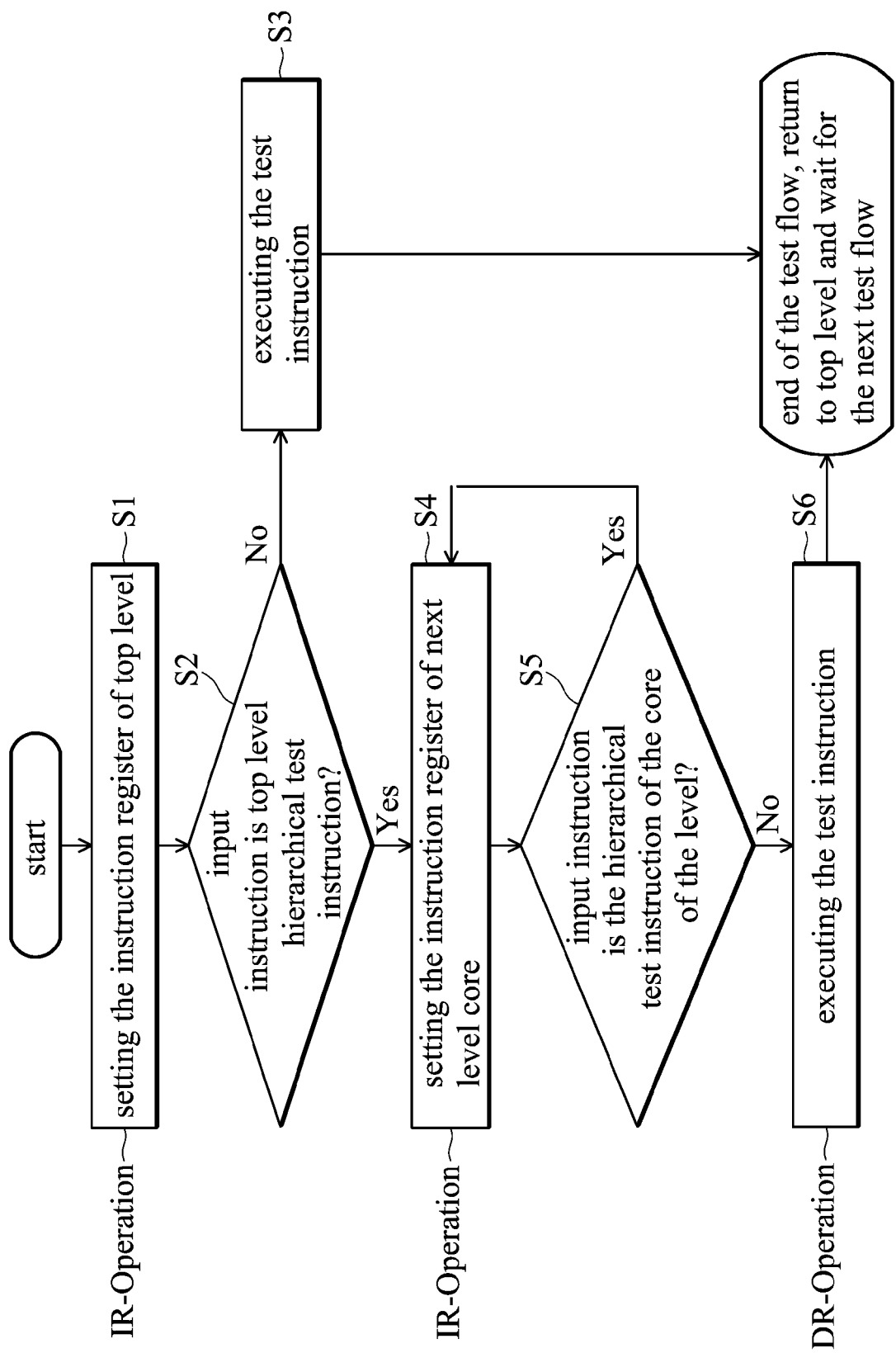
FIG. 7 is a flowchart for explaining the test method for the hierarchical test architecture of the embodiment of the present invention.

At the end of the test flow, the state register is changed from the Select-DR-Scan state into the Select-IR-Scan state. After entering the next test clock (TCK), if the state register is changed from the Select-IR-Scan state into the Capture-IR state, which indicates that the instruction register is ready for receiving the next test instruction, then the Wrapper-Enable signal is disabled. Specifically, the TAP controller finishes controlling the test wrapper of the next level and returns to control the level. The test flow described above is referred to as a hierarchical test operation, as shown in FIG. 7.

After the test flow has started, the instruction register of the top level (S1) is set, which is called the instruction register operation flow (IR-Operation). Next, it is determined whether an input instruction is a top level hierarchical test instruction (S2). If the input instruction is not the top level hierarchical test instruction, then the test instruction (S3) is executed. If the input instruction is the top level hierarchical test instruction, then the instruction registers of the next level cores (S4) are set, which indicate that the instruction register operation flow (IR-Operation) can be repeatedly executed by multiple times (N times). Next, it is determined whether an input instruction is the hierarchical test instruction of one of the cores of the level (S5). If the input instruction is the hierarchical test instruction of the core of the level, then the operation flow returns to step S4 to set the instruction registers of the next level cores. If the input instruction is not the hierarchical test instruction of the core of the level, then the test instruction (S6) is executed, wherein this step is the data register operation flow (DR-Operation) step. When the test instruction is completed (step S3 and S6), then the test flow returns to the top level, and waits for the next test flow.

Note that in the embodiment of the present invention, the instruction register operation flow needs to be operated N+1 times (from 0th level to Nth level) before testing the cores of the level N. Additionally, the test flow always directly returns to the top level controller after completing the test flow of any tested level. Furthermore, all the finite state machines in all of the TAP controllers of the present invention have to stay at the same state.

Figure 8A:
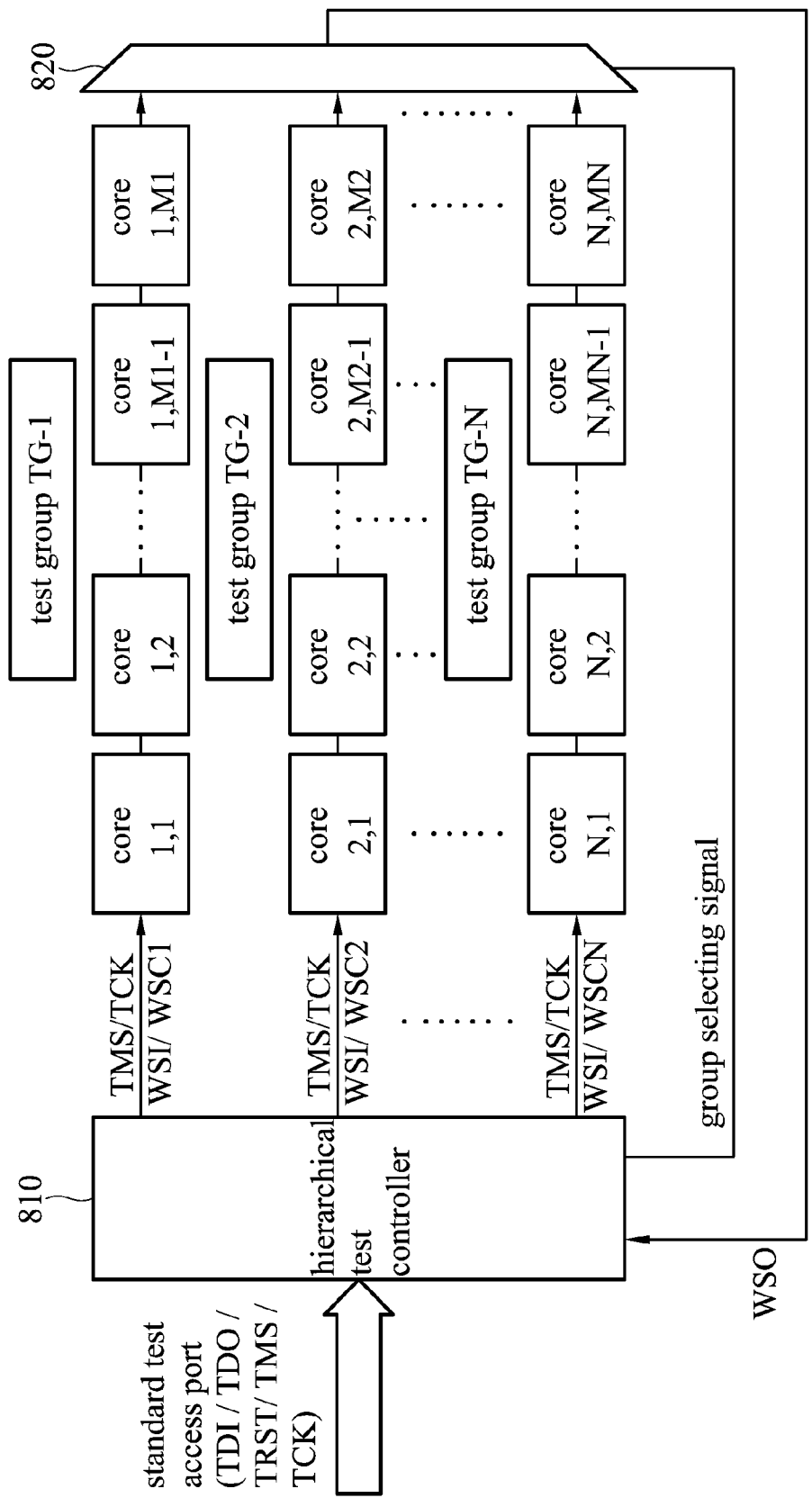
FIG. 8A is a schematic view showing a SoC mixed test architecture of the exemplary embodiment of the present invention.

FIG. 8A is a schematic view showing a SoC mixed test architecture of the exemplary embodiment of the present invention. In this architecture, multiple test groups (TG-1~TG-N) are connected together, wherein each test group comprises multiple cores (such as Core 1,1 , Core 1,2, . . . Core 1,M1 -1, Core 1,M1, Core 2,1, Core 2,2, . . . Core 2,M2-1, Core 2,M2 , . . . , Core N,1, Core N,2, . . . Core N,MN−1, Core N,MN). The test input signals (WSI1~N) of each test group is directly fanned-out to the wrapper of the first core of each test group by the test controller 810, and the test output signal (WSO) is connected to the test input signal (WSI) of the next wrapper in turn. Meanwhile, the test output signal of the last wrapper is connected to the multiplexer 820 for setting one of the test output signals of the test groups as its output. The test control signals TMS and TCK are connected from the top level test controller to each same signal input port of the core with the IEEE 1149.1 standard wrapper directly by means of a fan-out. There are two connections methods, if the test group comprises the cores wrapped with the IEEE 1500 standard wrapper, and they are as follows. One method is that the test controller only provides one set of the standard test control signals (WSC) which are connected to all cores wrapped with the IEEE 1500 standard wrapper. Another method is that the corresponding set of WSC standard test control signals (WSC1-N) of each test group are connected to the same input port of the cores. The cores of the same test group are connected to the same set of WSC test control signals. The cores of different test groups are connected to different set of WSC test control signals.

The multiplexer is set by the test controller. There are two ways for setting the multiplexer, one is to select different groups by using different instructions, and the other is to setting by a test group identity (ID) register. In method one, if the test instruction stored in the instruction register is the group test instruction of a group of test groups, the output of the multiplexer is set to be the test output of the test group by the test controller. In method two, every test group has only one GroupID. If the value of the test group ID register is equivalent to the GroupID of a group of test groups, the test controller sets the output signal of the multiplexer to be outputted by the test group (i.e. set the logic value of the select lines of the multiplexer equivalent to the value of the test group ID register). Only one group can be tested by the test architecture of the test controller in FIG. 8, but multiple cores in the same test group can be tested in parallel.

Previously, for hierarchical reset circuits, after five 1's are inputted in a row to the test mode select (TMS) signal, the TAP controller enters a Test-Logic-Reset state, resets all control signal registers, and sets all instruction registers as Bypass instructions (the core wrapped with the IEEE 1149.1 wrapper) or WS_BYSS (the core wrapped with the IEEE 1500 wrapper). In the embodiment of the invention, when five 1's are received by TMS input of the test controller of the top level (level 0) in a row, if the instructions of the instruction register are hierarchical core test instructions (ex. Core_Test), then the TAP controller enters the Test-Logic-Reset state, but the control signal register is not reset by the test controller of the level and the WRSTN signal is set to 0 (the WRSTN signal is an active-low signal). Thus, the test controller only resets the next level test controller and sets the instruction register of all test wrappers controlled by the test controller as the Bypass instruction, and does not reset all control signal registers, all data registers and all instruction registers of the test controller and the test controller of a previous level.

Figure 8B:
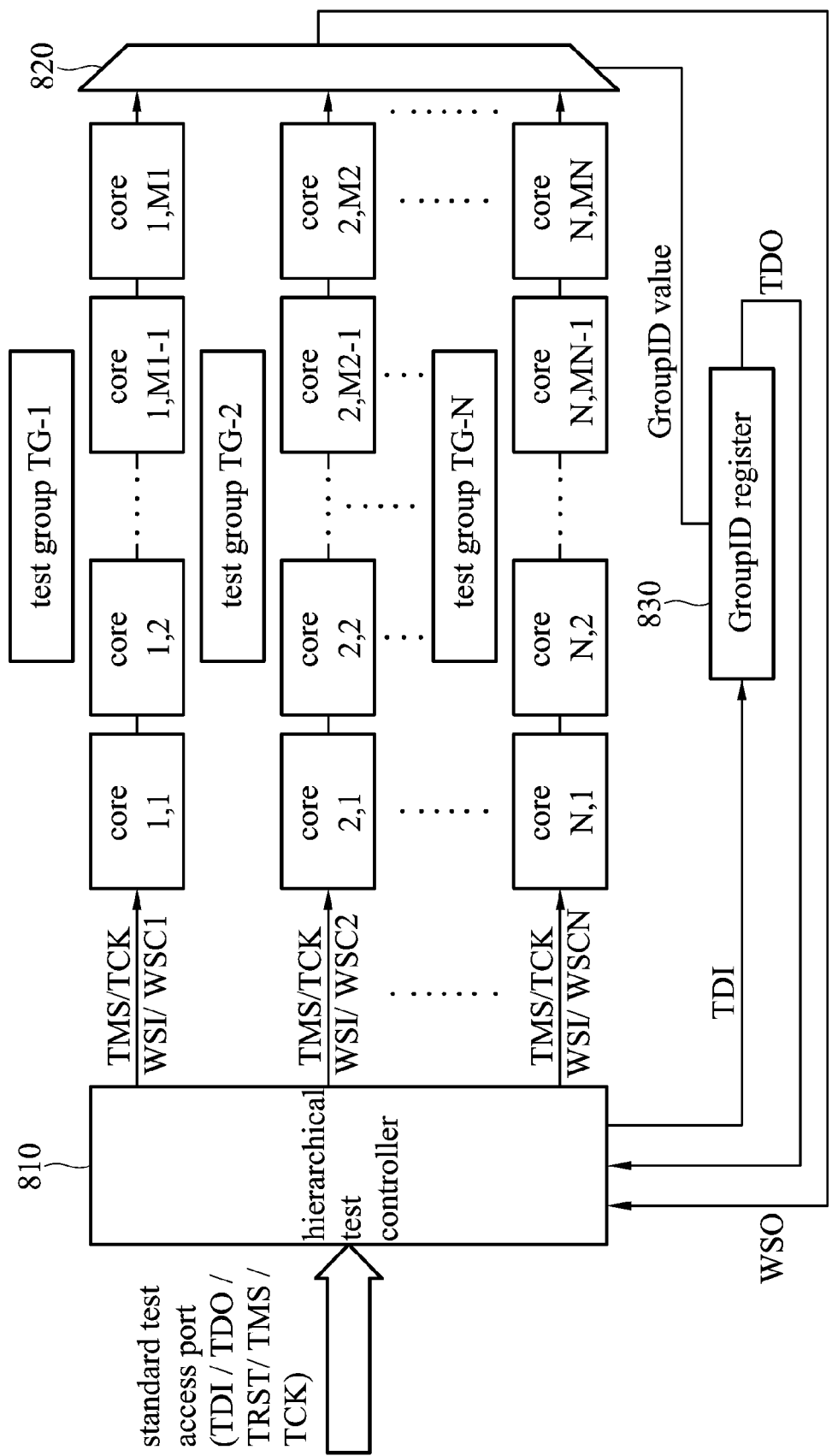
FIG. 8B is a schematic view showing a SoC mixed test architecture of another exemplary embodiment of the present invention.

FIG. 8B is a schematic view showing a SoC mixed test architecture of another exemplary embodiment of the present invention. The main difference between the hierarchical test architecture of FIG. 8B and FIG. 8A is that the group under test is determined by a GroupID register 830.

The following is detailed description of the control flow of the instruction register in test controller of the hierarchical test architecture.

Figure 9A:
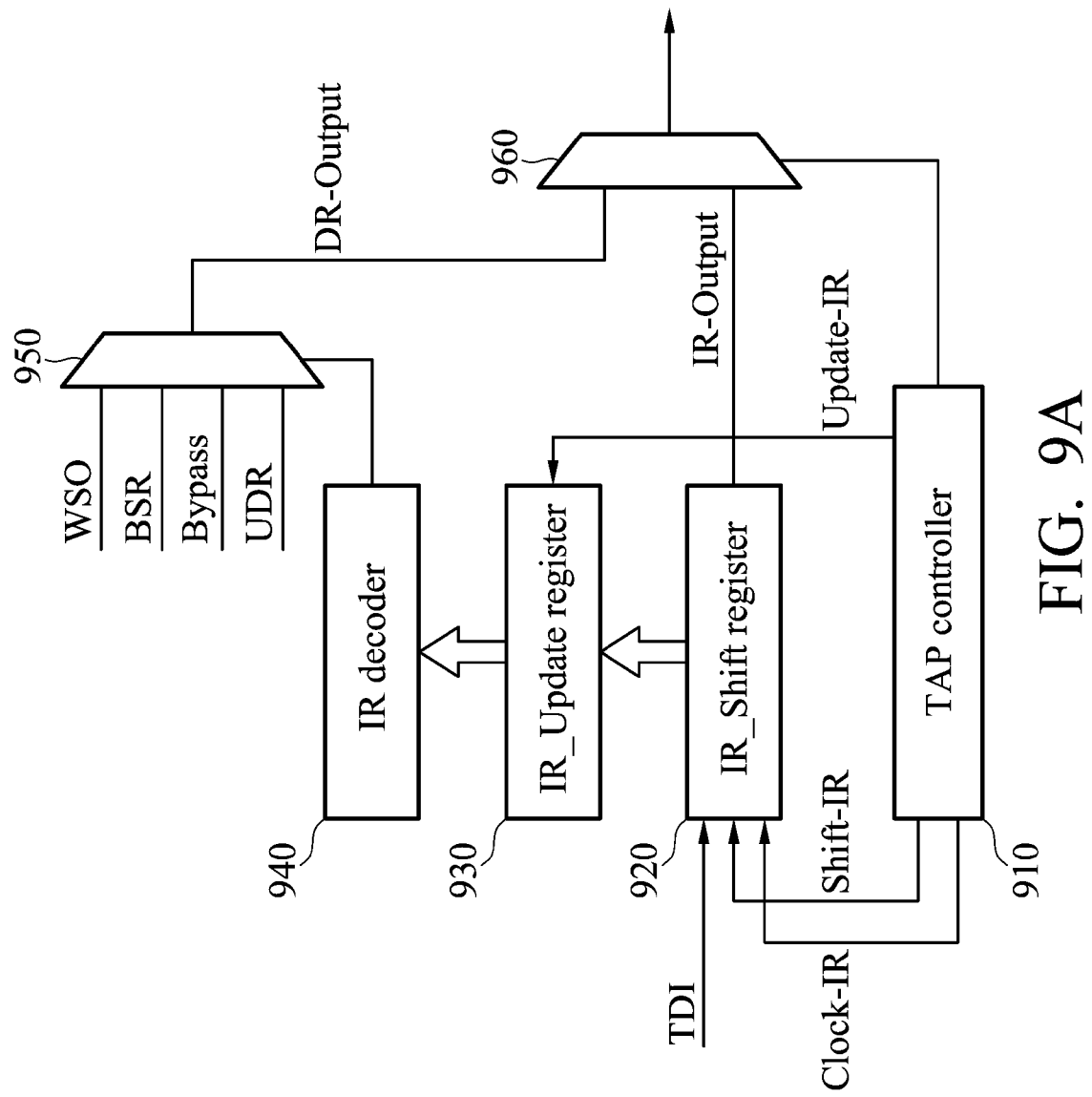
FIG. 9A is a schematic view of the IEEE 1149.1 standard instruction register controller.

FIG. 9A is a schematic view of the architecture of the instruction register.

The architecture comprises a TAP controller 910, an IR_Shift register 920, an IR_Update register 930, an IR decoder 940 and multiplexers 950 and 960. The multiplexer 950 is a Select_DR multiplexer, and the multiplexer 960 is a Select DR/IR multiplexer. The TAP controller 910 or the external input instruction is in turn transferred to IR_Shift register 920, IR_Update register 930 and IR decoder 940. The WSO, BSR, Bypass, UDR and TDI are external input/output signals, wherein the TDI is from the TDI signal of most external levels, the BSR/Bypass/UDR are outputs of the data registers and the WSO is the serial output signal of the next level. One of the output signals of the data registers and the next level is selected as the output of the multiplexer 950 by the IR decoder 940. One of the output signals of the multiplexer 950 and the IR_Shift register 920 is selected to output to a TDO output register by the multiplexer 960. The output of the TDO register is connected to most external TDO signals.

The instruction register is composed of two parts, comprising an IR_Shift register 920 and an IR_Update register 930. The IR_Shift register 920 is controlled by the Shift_IR, wherein the Clock_IR is the clock signal for storing the instruction values from the TDI. Herein, the instruction values are only temporary values, and do not have any other functions. The IR_Shift register 920 hold an original value when the state register is not Shift-IR, and the test data from TDI can be shifted into the IR_Shift register 920 as the test instruction when the Shift-IR signal is equal to 1 (i.e. the state register is changed to Shift-IR. When the state register is changed to the Update_IR state (i.e. Update-IR signal is equal to 1), the instruction stored in the IR_Shift register 920 is updated to the IR_Update register 930.

The IR decoder 940 controls one of the outputs of the data registers connected to the input (i.e. DR-Output) of the multiplexer 960 by controlled the multiplexer 950. The TAP controller 910 controls the output of the multiplexer 960. The output of the multiplexer 960 is the DR-Output when the state register is the data register operation flow, and the output of the multiplexer 960 is the IR-Output when the state register is the instruction register operation flow.

Figure 9B:
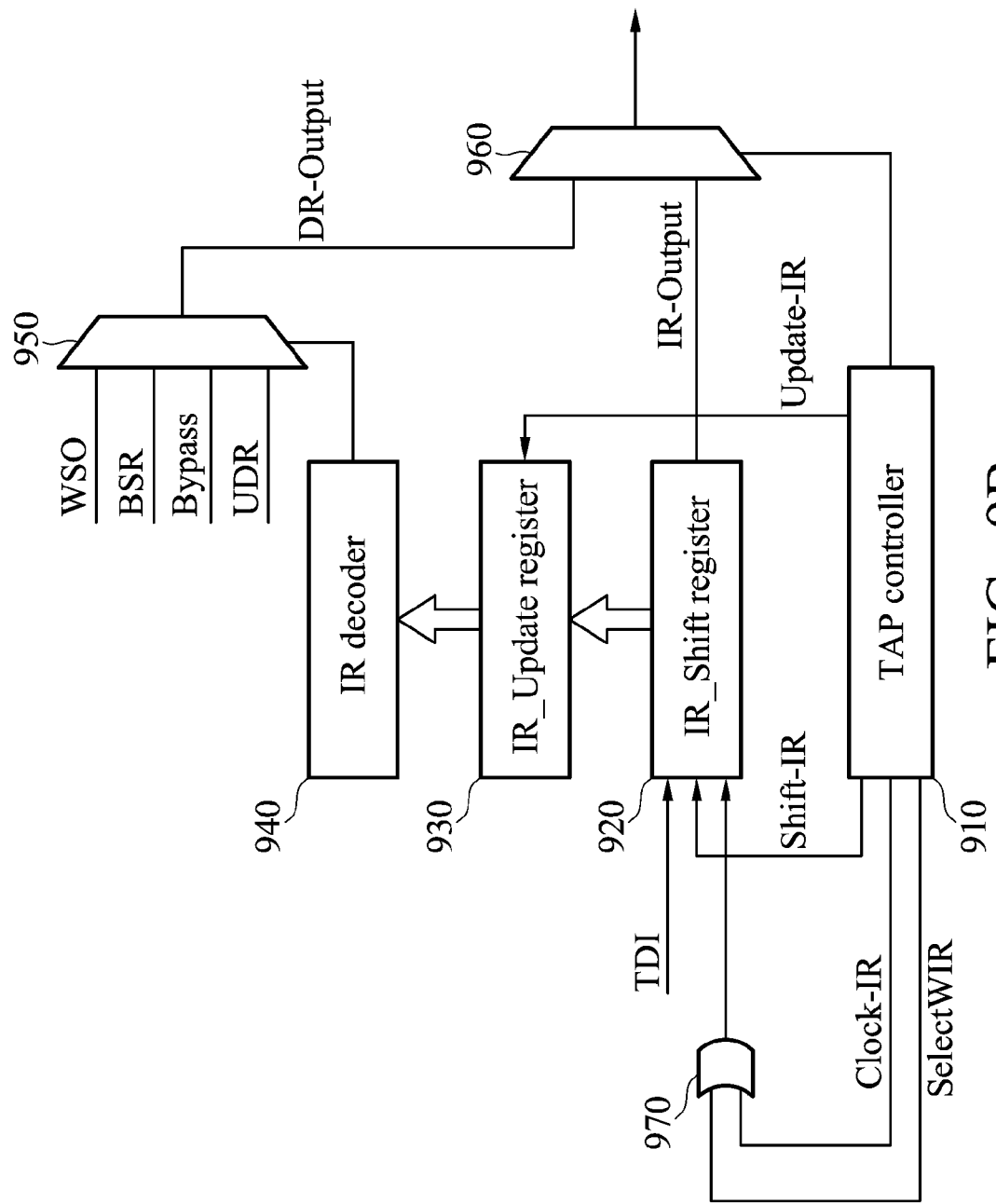
FIG. 9B is a schematic view of the instruction register controller of the embodiment of the present invention.

FIG. 9B is a schematic view of the instruction register of one embodiment of the present invention.

The structure in FIG. 9B comprises a TAP controller 910, an IR_Shift register 920, an IR_Update register 930, an IR decoder 940, multiplexers 950 and 960 and an OR gate 970. The clock signal of the IR_Shift register 920 is connected to the output of the OR gate 970. When the SelectWIR signal is 1, the clock signal of the IR_Shift register 920 is equal to 1 and the value stored in the IR_Shift register 920 is not changed. When the SelectWIR signal is 0, the output of the OR gate 970 is equal to Clock-IR signal, and the test data from TDI can be shifted into the IR_Shift register 920 as the test instruction.

FIG. 9C is a schematic view of the instruction register of another embodiment of the present invention.

The structure in FIG. 9C comprises a TAP controller 910, an IR_Shift register 920, an IR_Update register 930, an IR decoder 940, multiplexers 950 and 960, an AND gate 980 and an inverter 990.

The shift enable signal of the IR_Shift register 920 is connected to the output of the AND gate 980, and when the shift enable signal of the IR_Shift register 920 is set to 1, the test data from TDI can be shifted into the IR_Shift register 920 at the rising edge of the Clock-IR. When the SelectWIR signal is 1, the output of the inverter 990 is set to 0. Thus, the output of the AND gate 980 is set to 0, the IR_Shift register 920 can not receive the test instruction from TDI, and the value of the IR_Shift register 920 remains the same.

Figure 10:
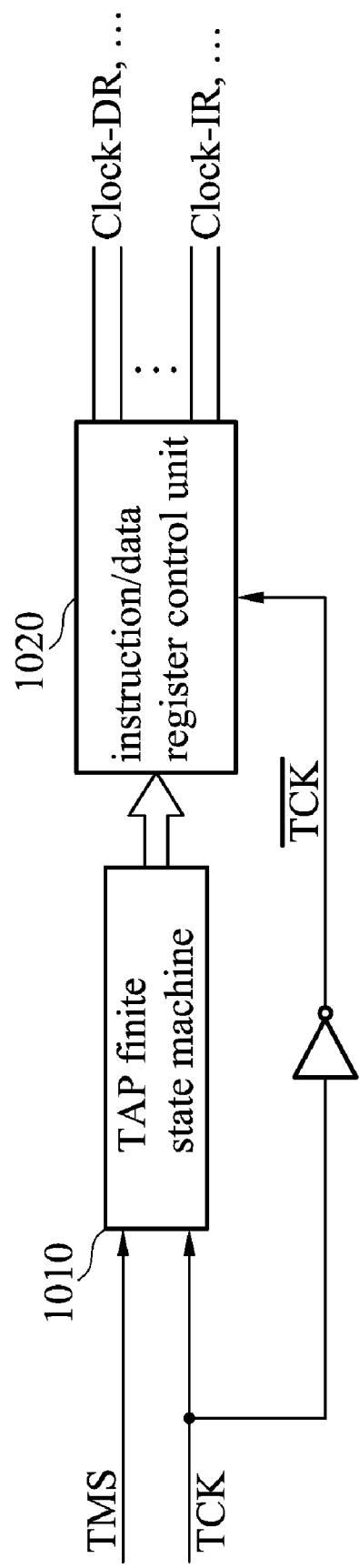
FIG. 10 is a schematic view showing the architecture of the IEEE 1149.1 standard TAP controller.

FIG. 10 is a schematic view showing the architecture of a traditional TAP controller comprising a TAP finite state machine 1010 and an instruction/data register control unit 1020.

The TAP finite state machine 1010 is composed of the state register of 16 states (4-bit wide) and some logic circuits for decision-making. New state values are generated based on the TMS value and the current state at the rising edge of the TCK (as shown in FIG. 5). The arrows in the figure indicate transmitting a 4-bit state value to the next logic circuit block.

The instruction/data register control unit 1020 (composed of some inverters and logic gates) generates the signals (such as Clock-DR, Shift-DR, Capture-DR, Update-DR etc (i.e. CS1 described above) for controlling the data register based on the state value, the signals (such as Clock-IR, Shift-IR, Update-IR etc.) for controlling the instruction register, and the control signals added by the user according to requirements (not shown).

Figure 11:
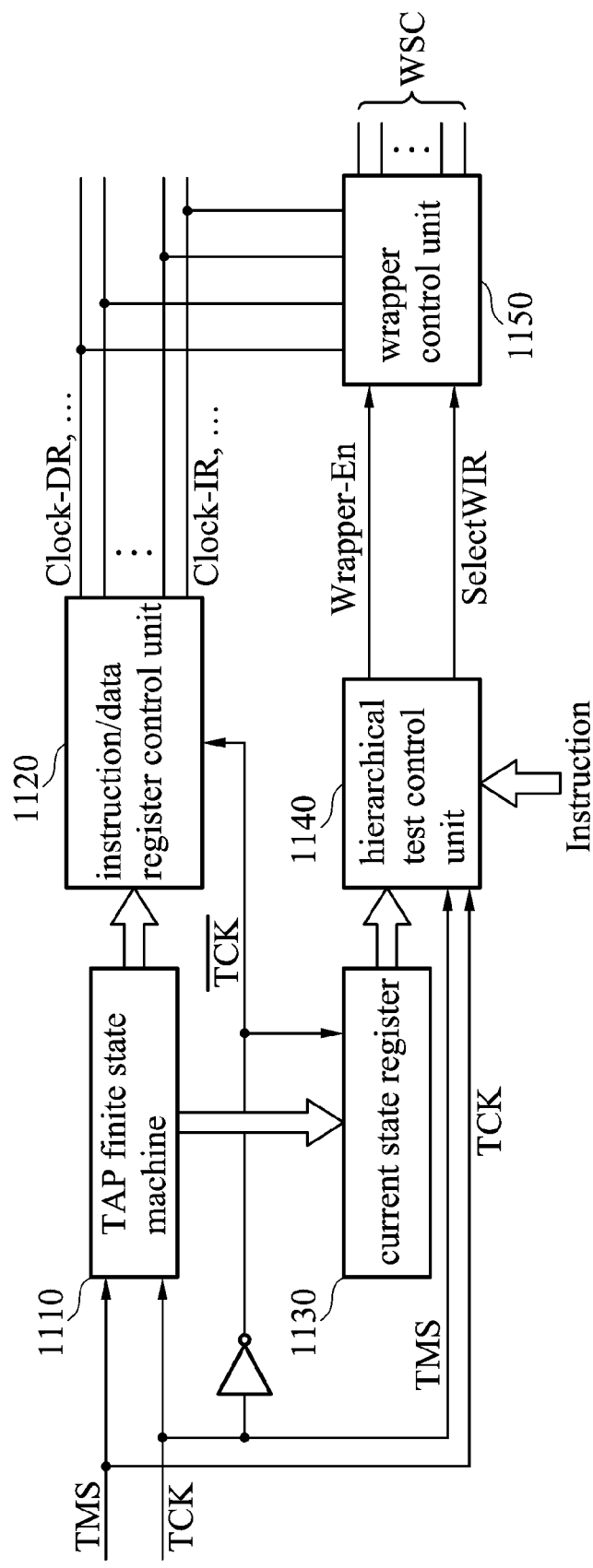
FIG. 11 is a schematic view showing the architecture of the controller of the hierarchical test architecture of the embodiment of the present invention.

FIG. 11 is a schematic view showing the architecture of the TAP controller of the embodiment of the present invention comprising a TAP finite state machine 1110, an instruction/data register control unit 1120, a current state register 1130, a hierarchical test controller 1140 and a wrapper control unit 1150.

The TMS, TCK, Clock-DR and WSC are the input/output signal of the TAP controller, wherein the TMS/TCK are the signals come from the most external TMS/TCK port and the Instruction is the instruction value (which is equivalent to the instruction value outputted to the IR decoder) from the instruction update register (IR_Update register). The WSC is the control signal for controlling the next level testing. The Clock-DR, Shift-DR, Capture-DR and Update-DR are signals for controlling the data register and the Clock-IR, Shift-IR and Update-IR are signals for controlling the instruction register.

The TAP finite state machine 1110 within the TAP controller is composed of the state register of 16 states (4-bit width) and some logic circuits for making decisions. The arrows in the figure indicate transmitting the 4-bit state value to the next logic block. The instruction/data register control unit 1120 composed of some inverters and logic gates generates the control signals (comprising Clock-DR, Shift-DR, Capture-DR, Update-DR etc. (the CS1 described above) of the data register and the control signals (Clock-IR, Shift-IR, Update-IR etc. for controlling the instruction register) of the instruction register based on the state value.

The hierarchical test control unit 1140 sets the values of the two control signals of the Wrapper-Enable and SelectWIR based on the values of the current state register 1130 and TMS. The Shift-IR and Shift-DR signals are connected to the inputs of the OR gate inside the wrapper control unit 1150, and the output is the ShiftWR signal (same generating method as the UpdateWR and the CaptureWR) of the WSC. The only exception is that the Clock-IR and the Clock-DR perform the AND operation and generate the WRCK, wherein all signals perform logic operations with the Wrapper-Enable before output. All WSCs will be enabled when the Wrapper-Enable is enabled, and the WRCK is changed according to the Clock-DR and the Clock-IR. The SelectWIR is outputted directly without any operation. The WSI is outputted by the TDI directly, and the output of the WSO is determined by the IR decoder as described previously.

To conclude, the test controller in the test device of the controllable hierarchical test architecture of the embodiment can be shared by the IEEE 1149.1 and the IEEE 1500 standard cores for achieving hierarchical testing. The test controller can select whether to change the test level or not based on the instructions stored in the instruction register by using the test controller of the embodiment of the invention when the TAP finite state machine enters the Select-DR-Scan state.

In addition, the test controller of the embodiment allows all TAP finite state machines to remain in the same state (ex. all TAP finite state machines enter the Update-IR state at same TCK cycle), wherein the only difference is that the TMS signal and the TDI signal can only change the instruction registers of the IEEE 1149.1 or 1500 standard test wrappers which are under test. Therefore, no extra TAP linking module (TLM) is needed for selecting the test controller, and only one logic gate is needed to control the clock signal if the instruction register is needed for determining whether the instruction register should input new instructions or maintain original instructions.

While the invention has been described by way of example and in terms of the embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A test device for controlling a hierarchical test architecture, comprising:
    a top test level, comprising:
        a top level data register; and
        a top level test controller, obtaining a plurality of test control signals and generating a plurality of control signals, wherein the control signals comprise a first set of control signals and a second set of control signals, and controlling the top level data register using the first set of control signals; and
    a next test level, composed of one or more cores having a test wrapper, wherein the core is controlled by the top level test controller using the second set of control signals,
    an instruction decoder, an instruction register, a multiplexer and a state register, wherein the instruction register receives the data from a test data input signal and stores the data from the test data input signal as a test instruction, the instruction decoder is connected to output ports of the instruction register for receiving the test instruction, and the multiplexer selects a register connected to the standard test output port of the controller based on the test instruction and the value of the state register.

2. The test device as claimed in claim 1, wherein the test control signals are composed of a test mode select signal and a test clock signal.

3. The test device as claimed in claim 1, wherein the first set of control signals is generated by the top level test controller for controlling the control signals of the data register.

4. The test device as claimed in claim 1, wherein the second set of control signal comprises the test control signals and a set of wrapper serial control signals, wherein the set of wrapper serial control signals is generated by the top level test controller and is in compliance with the IEEE 1500 standard serial test control signal.

5. The test device as claimed in claim 1, wherein the core of the next test level is the hierarchical test circuit or the core is wrapped in compliance with the IEEE 1149.1 or 1500 standard test wrapper.

6. The test device as claimed in claim 5, wherein the control signals connected to the core are the test mode select signal and the test clock signal of the second set of control signals when the core connected to the control signals are wrapped in compliance with the IEEE 1149.1 standard test wrapper.

7. The test device as claimed in claim 5, wherein the control signals are the wrapper control signal of the second set of control signals when the core connected to the control signals are wrapped in compliance with the IEEE 1500 standard test wrapper.

8. The test device as claimed in claim 5, wherein if there is a hierarchical test circuit in the core, one or more cores can be added to the hierarchical test circuit as the cores of the next test level of the hierarchical test circuit.

9. The test device as claimed in claim 5, wherein the cores of the next test level comprises one or more hierarchical test circuits.

10. The test device as claimed in claim 5, wherein if there are no hierarchical test circuits in the next test level, the next test level does not comprise any further next test level.

11. The test device as claimed in claim 5, wherein the hierarchical test circuit comprises:
    a test level, composed of a hierarchical test controller and a data register; and
    a next test level, composed of one or more cores.

12. The test device as claimed in claim 11, wherein the hierarchical test controller obtains a plurality of test control signals and generates a plurality of control signals by using the test control signals, wherein the control signals comprise a first set of control signals and a second set of control signals, and controls the data register using the first set of control signals; and
    a next test level, composed of one or more cores having a test wrapper, wherein the cores are controlled by the hierarchical test controller using the second set of control signals.

13. The test device as claimed in claim 12, wherein the test control signals are composed of a test mode select signal and a test clock signal.

14. The test device as claimed in claim 12, wherein the first set of control signals is generated by the hierarchical test controller for controlling the control signals of the data register.

15. The test device as claimed in claim 12, wherein the second set of control signals comprises the test control signals and a set of wrapper serial control signals, wherein the set of wrapper serial control signals is generated by the hierarchical test controller and wrapped in compliance with the IEEE 1500 standard serial test control signal.

16. The test device as claimed in claim 1, wherein the top level data register is composed of a boundary-scan register, a bypass register and an optional user-defined data register.

17. The test device as claimed in claim 1, wherein the number of the cores is not a fixed number.

18. The test device as claimed in claim 1, wherein if there is a next test level in a test level, at least one of the cores has a hierarchical structure, and other cores are in compliance with IEEE 1149.1 or IEEE 1500 test standard.

19. The test device as claimed in claim 1, wherein if there is only one core in the next test level, the core is a hierarchical test circuit.

20. The test device as claimed in claim 1, wherein the top test level comprises a hierarchical test controller, and each test level of the next and further test levels comprise one or more cores in compliance with the IEEE 1149.1, IEEE 1500 or have a hierarchical test structure.

21. The test device as claimed in claim 20, wherein the control signals further comprise a control signal for controlling the operation of the test wrapper of the next test level, and a control signal for controlling whether the instruction register of the next level should operate or not.

22. The test device as claimed in claim 21, wherein the control signal for controlling whether the instruction registers of cores of the next level should operate or not controls the instruction register of the level and the instruction registers of cores of the next level, and the instruction register of the level can receive a test instruction when the control signal is disabled, and the instruction register of the level can not receive the test instruction and the instruction registers of the cores of the next level can receive the test instruction, when the control signal is enabled.

23. The test device as claimed in claim 21, wherein the control signal for controlling whether the instruction registers of cores of the next level should operate or not and a Clock-IR signal of the level are connected to two inputs of an OR gate, and an output port of the OR gate is connected to the clock signal of the instruction register of the level.

24. The test device as claimed in claim 21, wherein the control signal for controlling whether the instruction registers of cores of the next level should operate or not is first connected to an input of an inverter, the output of the inverter and the Shift-IR signal of the level are connected to two inputs of an AND gate, and the output port of the AND gate is connected to the shift enable signal of the instruction register of the level.

25. The test device as claimed in claim 20, wherein the control signal for controlling the operation of the test wrapper of the next test level controls all instruction registers and all data register of all cores of the next level, one or more instruction registers and data registers of the next level can not receive the test instruction and receive or output the test data when the control signal is disabled, and the instruction registers and the data registers of the cores of the next level can receive the test instruction and receive or output the test data when the control signal is enabled.

26. The test device as claimed in claim 1, wherein the register is the instruction register or data register.

27. The test device as claimed in claim 1, wherein the value of the state register is copied to a current state register when the test clock signal falls within the falling edge.

28. The test device as claimed in claim 1, wherein the test controller is composed of a standard test access port finite state machine, a plurality of control signal registers and a plurality of control signals, the hierarchical test controller receives a plurality of signals from the outer test access port and generates a plurality of corresponding test states, and enables or disables the test control signals based on the test state and the instruction value stored in the instruction register.

29. The test device as claimed in claim 20, wherein all of the state registers within the test controllers having the test access finite state machine are set with the same values.

30. The test device as claimed in claim 27, wherein when the test clock signal changes to a rising edge, if the current state register is in a select-instruction register-scan state, a control signal of the test controller of the level for controlling whether the instruction registers of cores of the next level should operate or not is enabled, and the test mode select signal is 0, which indicates that the instruction registers of cores of the next test level are ready for receiving the next test instructions, and each control signal for controlling the operation of the test wrapper of the next test level of each level are enabled.

31. The test device as claimed in claim 27, wherein when the next test clock signal changes to a rising edge, if the current state register is in a select-instruction register-scan state, a control signal of the test controller of the level for controlling whether the instruction registers of cores of the next level should operate or not is disabled, and the test mode select signal is 0, which indicates that the test controller of the level is ready for receiving the next test instruction, and each control signal for controlling whether the test wrapper of the next test level should operate or not are disabled.

32. The test device as claimed in claim 27, wherein when the next test clock signal changes to a rising edge, if the current state register is in a select-data register-scan state, the instruction value of an instruction register of the test controller of the level is a hierarchical instruction and the test mode select signal is 1, which indicates that the instruction registers of the cores of the next level is ready for receiving test instructions, and a control signal of the test controller of the level for controlling whether the instruction registers of the cores of the next level should operate or not is enabled, and the instruction register of the test controller of the level is disabled, wherein the test instruction value stored in the instruction register remains.

33. The test device as claimed in claim 27, wherein when the next test clock signal changes to a rising edge, if the current state register is in a select-data register-scan state, the instruction value of an instruction register of the test controller of the level is a hierarchical instruction, a control signal of the hierarchical test controller for controlling whether the instruction registers of the cores of the next level should operate or not is enabled, and the test mode select signal is 0, which indicates that the cores of the next level is ready for testing, and a control signal of the test controller of the level for controlling whether the instruction registers of the cores of the next level should operate or not is disabled, and the data registers of cores of the next level are enabled for receiving the test data.

34. A test device for controlling a hierarchical test architecture, comprising:
- a plurality of test groups connected in parallel, wherein each test group comprises one or more cores; and
- a hierarchical test controller, inputting a plurality of test control signals into the test groups respectively, wherein each control signal corresponds to a test group respectively for testing the cores of each test group and controlling test outputs of the test groups,
- wherein a multiplexer is set by the test controller, by using different group test instructions for selecting different test groups, or setting a test group by a test group identifier in an identifier register.

35. The test device as claimed in claim 34, wherein the test controller sets that the test data of the multiplexer is output through the test group when the test group identifier in the identifier register is similar to a test group identifier of a test group.

36. The test device as claimed in claim 34, wherein each group test instruction corresponds to a test group, and the test controller set that the test data of the multiplexer is output, is output by the test group when the instruction register of the test controller is the group test instruction corresponding to the test group.

37. The test device as claimed in claim 34, wherein only one group can be tested per testing, but a plurality of cores in the one group can be tested in parallel.

38. The test device as claimed in claim 34, wherein each test flow executed by the cores can test one or more cores under test within the same test group.

39. The test device as claimed in claim 34, wherein if any core within each test group is wrapped with the IEEE 1149.1 standard wrapper, then the test mode select signal and the test clock signal thereof are connected to the test mode select signal and the test clock signal corresponding to the outer test access port.

40. The test device as claimed in claim 34, wherein if any core within each test group is wrapped with the IEEE 1500 standard wrapper, then the standard test control signal of the core is connected to the IEEE 1500 standard test control signal provided by the hierarchical test controller.

41. The test device as claimed in claim 34, wherein if any core within each test group is wrapped with the IEEE 1500 standard wrapper, then the standard test control signal of the core is connected to the IEEE 1500 standard test control signal provided by the hierarchical test controller to the test group.

* * * * *